US012057499B2

(12) United States Patent
Grote et al.

(10) Patent No.: US 12,057,499 B2
(45) Date of Patent: Aug. 6, 2024

(54) TRANSISTOR DEVICES WITH TERMINATION REGIONS

(71) Applicant: NXP USA, INC., Austin, TX (US)

(72) Inventors: Bernhard Grote, Phoenix, AZ (US); Saumitra Raj Mehrotra, Scottsdale, AZ (US); Ljubo Radic, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 535 days.

(21) Appl. No.: 17/139,820

(22) Filed: Dec. 31, 2020

(65) Prior Publication Data

US 2021/0126125 A1  Apr. 29, 2021

Related U.S. Application Data

(63) Continuation-in-part of application No. 16/141,674, filed on Sep. 25, 2018, now abandoned.

(51) Int. Cl.
*H01L 29/78* (2006.01)
*H01L 21/265* (2006.01)
(Continued)

(52) U.S. Cl.
CPC .. *H01L 29/7811* (2013.01); *H01L 21/823487* (2013.01); *H01L 27/088* (2013.01);
(Continued)

(58) Field of Classification Search
CPC ............ H01L 29/7809; H01L 29/7813; H01L 29/4078; H01L 29/1095; H01L 29/407;
(Continued)

(56) References Cited

U.S. PATENT DOCUMENTS

| 7,579,650 | B2 | 8/2009 | Cao et al. |
| 10,600,911 | B2 | 3/2020 | Grote et al. |

(Continued)

OTHER PUBLICATIONS

Non-final office action dated Oct. 29, 2021 in U.S. Appl. No. 16/692,517.

(Continued)

*Primary Examiner* — Samuel A Gebremariam
*Assistant Examiner* — Jonas T Beardsley

(57) ABSTRACT

A transistor device includes a substrate, a first current-carrying region having a first lateral width, and a second current-carrying region. A first trench is formed between the first current-carrying region and the second current-carrying region. The first trench includes a first vertical component sidewall coupled to the first current-carrying region and a second vertical component sidewall coupled to the second current-carrying region. A first termination region includes a first termination portion coupled to the first current-carrying region, a second termination portion coupled to the second current-carrying region, and a first trench termination portion coupled to the first trench. The first trench and the first trench termination portion surround a portion of the first current-carrying region, and the second current-carrying region and the second termination portion surrounds a portion of the first trench and the first trench termination portion. A width of the first termination portion exceeds the first lateral width.

21 Claims, 25 Drawing Sheets

(51) Int. Cl.
*H01L 21/8234* (2006.01)
*H01L 27/088* (2006.01)
*H01L 29/06* (2006.01)
*H01L 29/08* (2006.01)
*H01L 29/40* (2006.01)

(52) U.S. Cl.
CPC ........ *H01L 29/0696* (2013.01); *H01L 29/404* (2013.01); *H01L 29/407* (2013.01); *H01L 29/7809* (2013.01); *H01L 29/7813* (2013.01); H01L 21/26513 (2013.01); H01L 29/0882 (2013.01)

(58) Field of Classification Search
CPC ............. H01L 29/0696; H01L 29/7811; H01L 29/42368; H01L 29/42376
See application file for complete search history.

(56) References Cited

U.S. PATENT DOCUMENTS

| | | | |
|---|---|---|---|
| 2007/0274110 A1 | 11/2007 | Kitamura et al. | |
| 2010/0314681 A1* | 12/2010 | Hsieh | H01L 29/41766 257/334 |
| 2015/0097231 A1* | 4/2015 | Mathur | H01L 29/42368 438/270 |
| 2016/0268423 A1 | 9/2016 | Koepp et al. | |

OTHER PUBLICATIONS

Notice of Allowance dated Apr. 21, 2021 in U.S. Appl. No. 16/836,293.
Notice of Allowance dated Sep. 27, 2021 in U.S. Appl. No. 16/836,344.
Non-final office action dated May 12, 2021 in U.S. Appl. No. 16/141,674.
Non-final office action dated May 21, 2021 in U.S. Appl. No. 16/715,396.
Notice of Allowance dated Nov. 22, 2021 in U.S. Appl. No. 16/715,396.
Notice of Allowance dated Mar. 14, 2022 in U.S. Appl. No. 16/692,517.
Non-final office action dated Apr. 14, 2021 in U.S. Appl. No. 16/836,344.

* cited by examiner

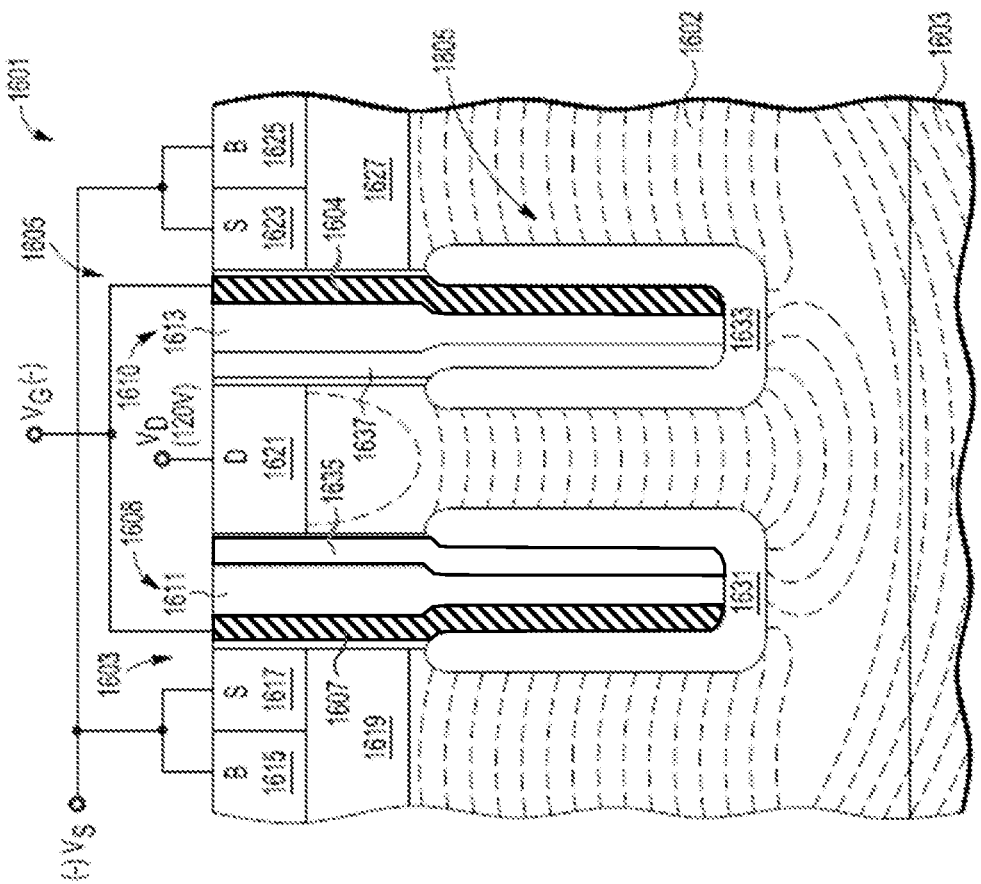
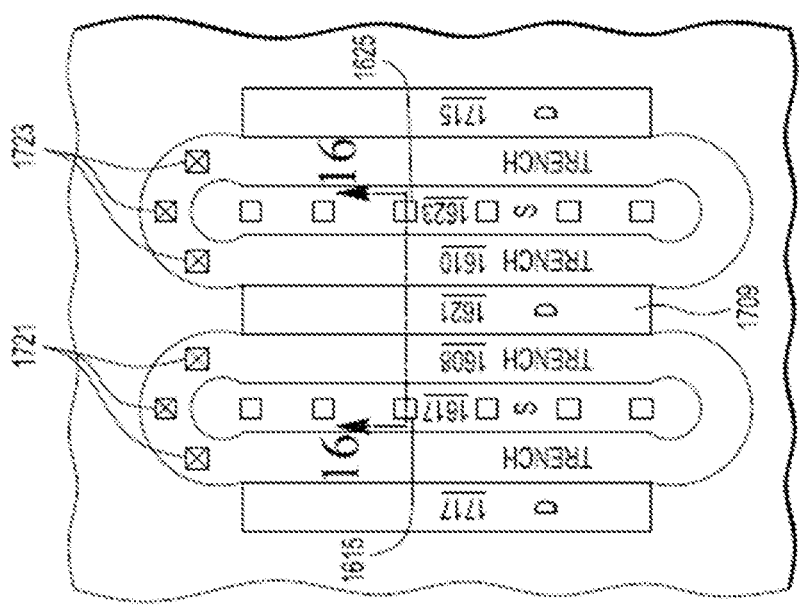
FIG. 17
FIG. 18

TRANSISTOR DEVICES WITH TERMINATION REGIONS

RELATED APPLICATIONS

This application is a continuation-in-part of U.S. patent application Ser. No. 16/141,674 filed on Sep. 25, 2018, entitled "Transistor Devices with Control-Terminal Field Plate Structures in Trenches," which is incorporated herein by reference in its entirety.

BACKGROUND OF THE INVENTION

Field of the Invention

This invention relates in general to transistor devices and more specifically to transistor devices with having control terminal-field plate structures in trenches.

Background

Some types of transistors include transistor structures located in trenches of a substrate. For example, some types of transistors include gate structures located in a trench.

BRIEF DESCRIPTION OF THE DRAWINGS

The present invention may be better understood, and its numerous objects, features, and advantages made apparent to those skilled in the art by referencing the accompanying drawings.

FIG. 17 sets forth a partial top view of a stage in the manufacture of a transistor device according to another embodiment of the present invention.

FIG. 18 is a partial side view illustration showing potential fields and the electrical coupling of a transistor device during an operating condition according to one embodiment of the present invention.

The use of the same reference symbols in different drawings indicates identical items unless otherwise noted. The Figures are not necessarily drawn to scale.

DETAILED DESCRIPTION

Figure 1:
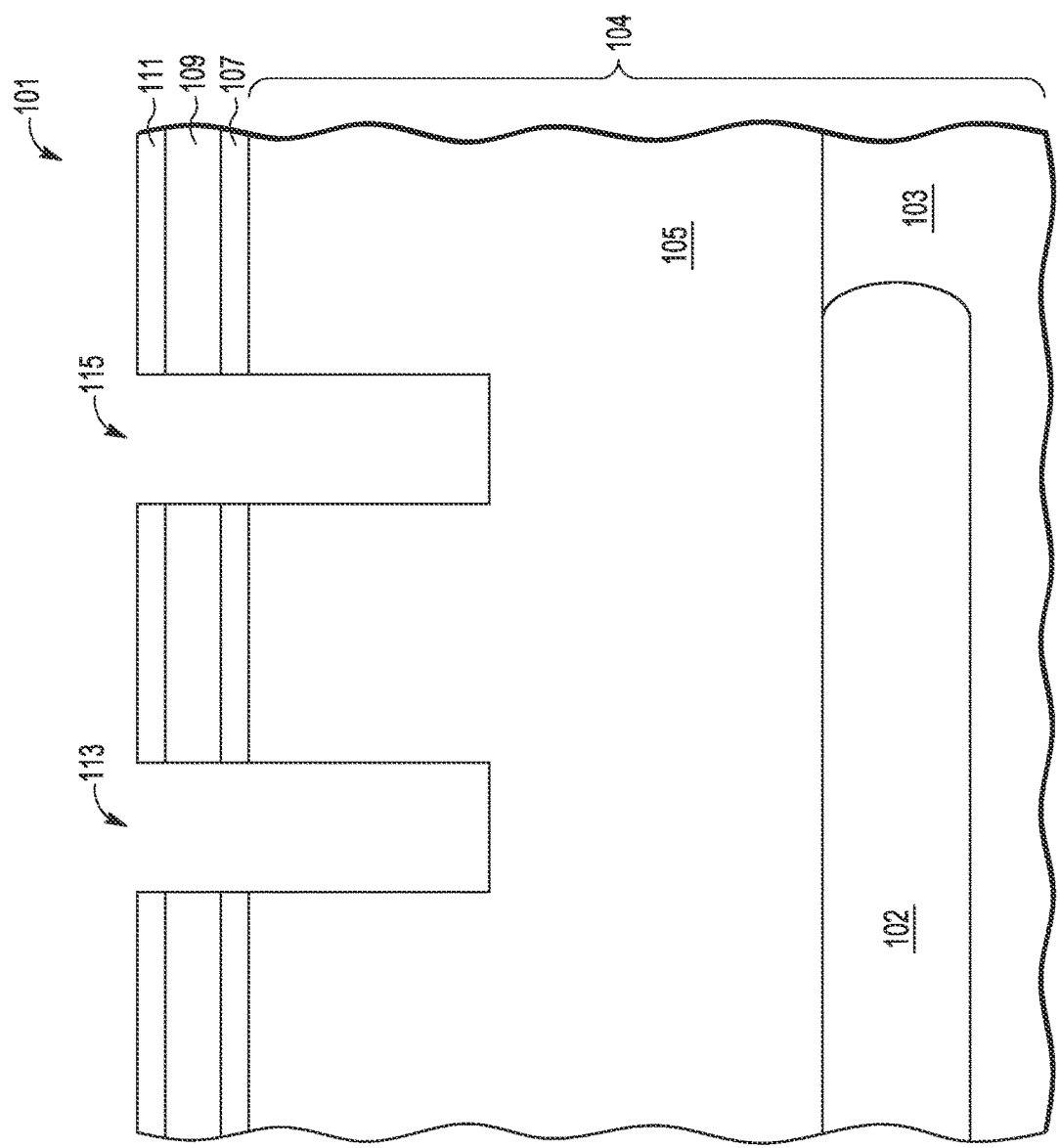
FIGS. 1 and 4-13 set forth partial cutaway side views of various stages in the manufacture of a transistor device according to one embodiment of the present invention.

The following sets forth a detailed description of a mode for carrying out the invention. The description is intended to be illustrative of the invention and should not be taken to be limiting.

As disclosed herein, a transistor device includes a conductive structure located in a trench of semiconductor material. The conductive structure serves as a control terminal and a field plate for a transistor. At a first location in the trench where the conductive structure functions as a control terminal for a transistor, the conductive structure is located a first lateral distance from the trench sidewall with dielectric located in between. At a second location in the trench where the conductive structure functions as a field plate, the conductive structure is located a second lateral distance from the trench sidewall with dielectric located in between. The second lateral distance is greater than the first lateral distance. In some embodiments, the trench is formed by etching two trenches in the semiconductor material, where the second trench is etched through an opening defined by sidewall spacers of the first trench.

In one embodiment, providing a transistor device with a conductive structure in a trench that serves as both a field plate and a control terminal for a transistor may allow in some embodiments for a simplified structure that occupies less area of a die than a transistor device that has separate control terminal structures and field plates. Providing a conductive plate that is separated by different thicknesses of dielectric at different locations allows for the conductive trench structure to be used as both a control terminal structure and a field plate structure. In some embodiments, the field oxide between the field plate portion and adjacent extended drain drift region of the trench sidewall can be optimized to achieve low RonA independent of the thickness of the gate dielectric.

In one embodiment, the transistor is part of a bidirectional transistor device which can be implemented as a bidirectional switch. A bidirectional transistor device is a device that can selectively block voltages in both directions and conduct current in both directions. The conductive control terminal/field plate structures for the transistors are spaced apart on opposing sides of a trench and can be biased at different voltages where an electrostatic field between the two conductive plate structures is located in a dielectric in between. Accordingly, with some such embodiments, the dielectric spacing between the sidewalls of the trench can be significantly reduced. Also, such a structure may allow for supporting the voltage in a vertical direction from the source of the transistor to a shared drain that has a portion located directly under the trench.

Bi-directional switches can be used in applications that require voltage blocking capability in both directions. In one example, a bi-directional switch is utilized in a reverse auto battery protection application. With some examples, the break-down voltage requirement can range from ±130 Volts (V) in each direction. Some conventional power MOSFETs are unidirectional where placing them in a back-to-back configuration doubles the source to drain resistance as well as the device area, such that the back-to-back on-resistance area (RonA) is quadruple the unidirectional device RonA. Consequently, with such an implementation based on back-to-back configuration of conventional power MOSFETs, four times the area is needed to achieve the same on-resistance as with a single unidirectional switch.

In other embodiments, the transistor is a high voltage unidirectional vertical transistor with the source located on one side of the trench and the drain located on the other side of the trench. An extended drain region includes a portion located under the trench. The plate is separated by a greater lateral distance from the drain side sidewall of the trench than from the source side sidewall of the trench to thereby allow for greater dissipation of the electric fields in the trench from the field plate to the higher voltage drain.

Figure 2:
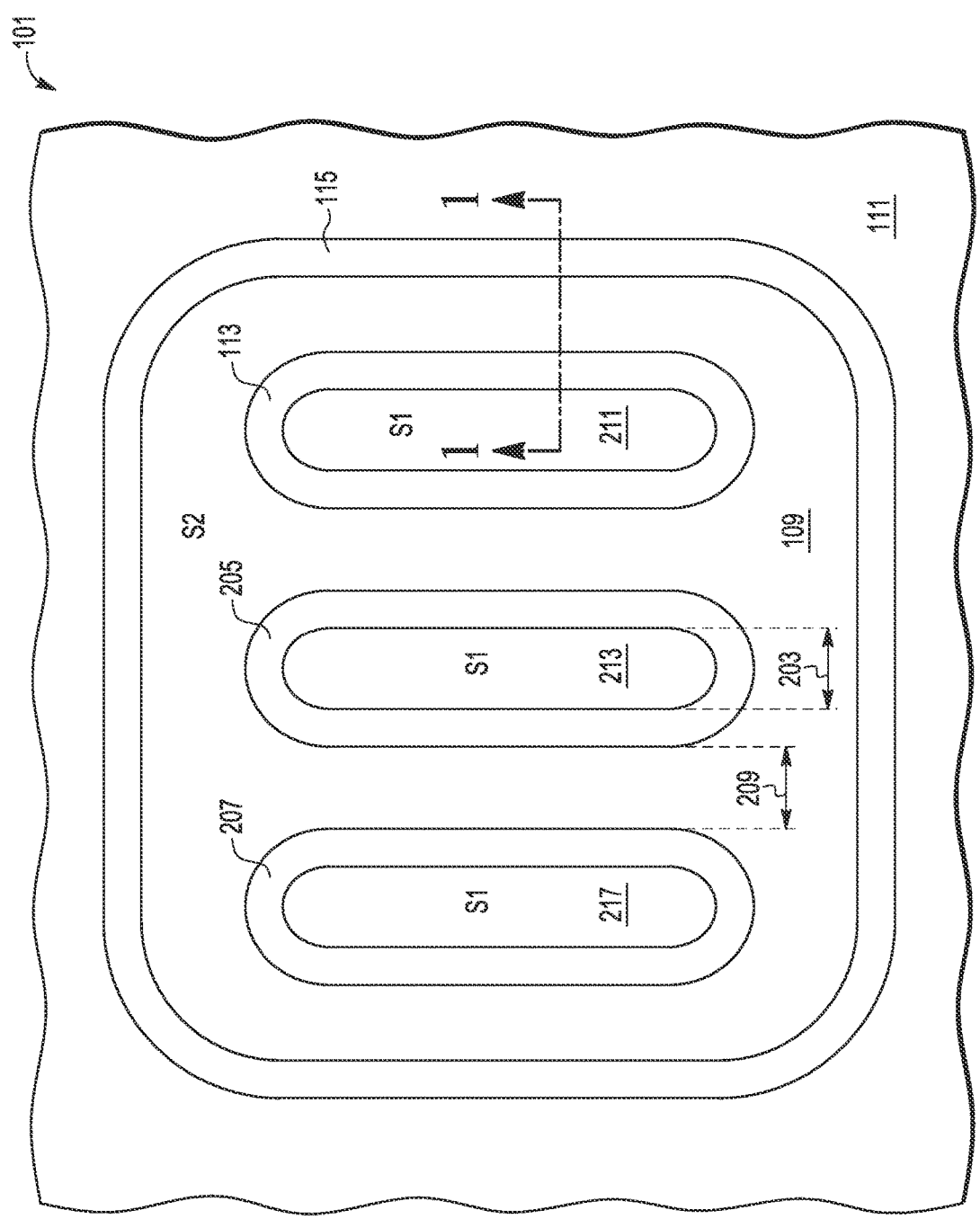
FIG. 2 sets forth a partial top view of a stage in the manufacture of a transistor device according to one embodiment of the present invention.
Figure 3:
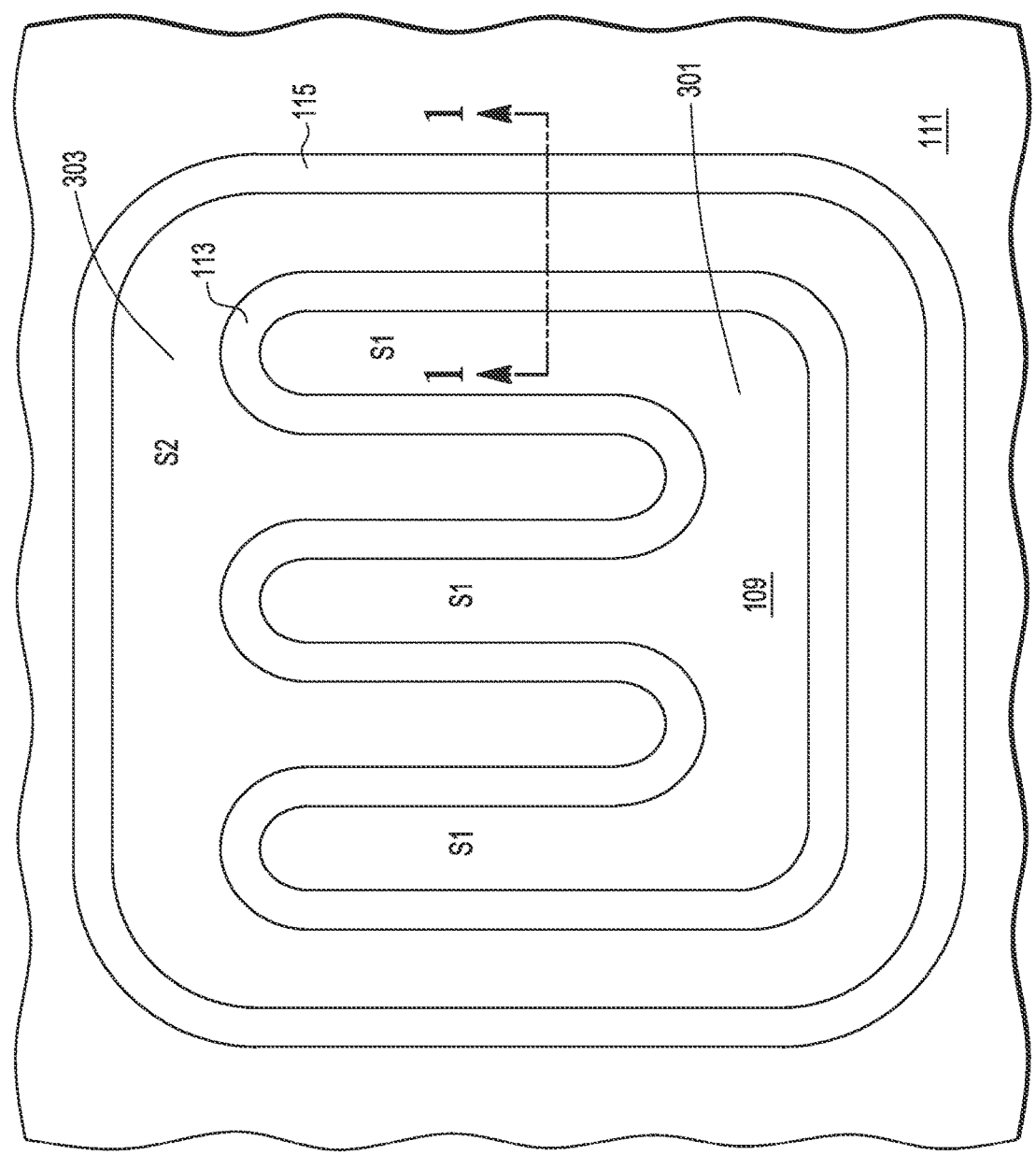
FIG. 3 sets forth a partial top view of a stage in the manufacture of a transistor device according to another embodiment of the present invention.

FIGS. 1 and 4-13 set forth partial cutaway side views of various stages in the manufacture of a bi-directional transistor device with a conductive structure that serves as a control terminal and field plate according to one embodiment of the present invention. FIGS. 2 and 3 set forth partial top views of a wafer during a stage in manufacture according to two different embodiments of the present invention. The location of the cutaway side view of FIG. 1 is shown in FIGS. 2 and 3.

FIG. 1 is a partial cutaway side view showing a top portion of wafer 101 with trenches 115 and 113 formed therein. In one embodiment, wafer 101 includes a substrate 104 of semiconductor material. Substrate 104 includes a semiconductor substrate layer 103 that has a net P-type conductivity doping. In one embodiment, substrate layer 103 is doped with boron and has a net P-type conductivity concentration of about $2e15$ $cm^{-3}$, but may be doped with other types of dopants and/or may be at other concentrations in other embodiments. In one embodiment, substrate layer 103 is made of monocrystalline silicon, but may be made of other semiconductor materials (e.g. silicon germanium, germanium, silicon carbide, gallium nitride, gallium arsenide, other semiconductor III-V materials) in other embodiments. In yet another embodiment, substrate layer 103 may be a semiconductor-on-insulator (SOI) substrate.

In the embodiment shown, wafer 101 includes a buried heavily doped N-type conductivity region 102. In one embodiment, region 102 is doped with an N-type dopant such as antimony at a dosage of about 1 el 5 $cm^{-2}$ and energy of 80 keV, but may be doped with other dopants, energies, and/or concentrations. In some embodiments, region 102 may be formed with multiple implantation steps, each having different dopants, energies, and/or concentrations. For example, in addition to the implantation of antimony, phosphorus may be implanted at a dosage of $5e12$ $cm^{-2}$ and at an energy of 900 keV in some embodiments. In some embodiments, utilizing a buried heavy N-type region may improve the symmetry of electrical properties in the forward and reverse bias directions of the bidirectional device as well as reduce the RonA of the device during operation by improving the conductivity of at least a portion of the virtual drain region during operation. Furthermore, relatively high doping in region 102 suppresses the parasitic PNP transistor formed between well regions and substrate. Although region 102 is shown as being located in layer 103, the dopants of region 102 may diffuse into 105 in some embodiments. Other embodiments do not include a buried heavy N-type region similar to region 102.

Substrate 104 includes a lighter doped N type layer 105 located over substrate layer 103. In one embodiment, layer 105 is doped with an N-type dopant but at a lighter concentration than region 102. In one embodiment, layer 105 is doped with arsenic or phosphorous at a concentration of about $5e16$ $cm^{-3}$ to support a breakdown voltage (BV)>60V in either direction, but may include other conductivity dopants and/or be at other concentrations in other embodiments, and for other BV targets. In one embodiment, region 102 may overhang the area of trench 115 as convenient for termination design.

In one embodiment, layer 105 is epitaxially grown from substrate layer 103. In one embodiment, layer 105 is made of monocrystalline silicon, but may be made of other semiconductor material in other embodiments. In one embodiment, the N-type dopants are formed in-situ during the epitaxial growth process, but may be implanted after formation in other embodiments. In one embodiment, region 102 has a thickness of about 1.5 um and layer 105 has a thickness of 4.0 μm, but each may be of other thicknesses in other embodiments, e.g. to achieve different BV targets. In one embodiment, layer 105 maybe part of substrate layer 103 which is subsequently implanted with N-type dopants, e.g. in an embodiment that does not include region 102.

A pad oxide layer 107, nitride layer 109, and oxide layer 111 are formed on layer 105. Afterwards, trenches 115 and 113 are formed in wafer 101. In one embodiment, trenches 115 and 113 have a width of 1.0 um and a depth of 1.3 um, but may have other widths and/or depths in other embodiments. In one embodiment, the trenches are formed by forming a patterned mask (not shown) on wafer 101 and then anisotropically etching layers 111, 109, 107, and layer 105 as per the pattern with the appropriate etch chemistries. In other embodiments, other types of hard mask layers may be utilized in forming trenches 115 and 113.

FIGS. 2 and 3 are partial top views of wafer 101 showing the extent of trenches 113 and 115 in wafer 101 according to two different embodiments. FIG. 2 shows that trench 113 has an oval shape and is similar to trenches 205 and 207. Trench 115 is a termination trench that surrounds trenches 207, 205, and 113. Trenches 207, 205, and 113 define pillar areas 217, 213, and 211, respectively. In one embodiment, termination trench 115 has the same width and depth as interior trenches (113), but in other embodiments, it may have a different width and/or depth.

Areas 217, 213, and 211 are labeled "S1" and will after subsequent stages include source regions that will be electrically coupled together to be biased at the same potential during operation. The area between trench 115 and trenches 207, 205, and 113 is labeled "S2" and includes source regions that will be electrically coupled together to be biased at the same potential during operation. Dimensions 209 represents the spacing between trenches 207 and 205 and dimension 203 represents the width of area 213. In one embodiment, these dimensions are the same (e.g. about 1 um), but may be different in other embodiments.

FIG. 3 shows an alternative embodiment where area 301 and area 303 form interdigitated comb structures separated by trench 113. Area 301 is surrounded by trench 113 and is labeled "S1" in FIG. 3. Area 301 includes source regions that will be electrically coupled together to be biased at the same potential during operation. Area 303 is outside of trench 113 and inside of trench 115. Area 303 is labeled "S2" in FIG.

3 and includes source regions that will be electrically coupled together to be biased at the same potential during operation. In other embodiments, the trenches may have different configurations and have different lengths, widths, number of comb fingers and/or spacings depending upon the desired parameters of the bi-directional transistors including the "effective" widths of the bi-directional transistors.

FIGS. 1 and 4-13 show a partial cutaway view of the bi-directional transistor device being manufactured in the areas shown in FIGS. 2 and 3. A full view of the device along the cross section of FIGS. 1 and 4-12 would show 8 trench cross sections instead of the two trench cross sections shown in the views of FIG. 1.

Figure 4:
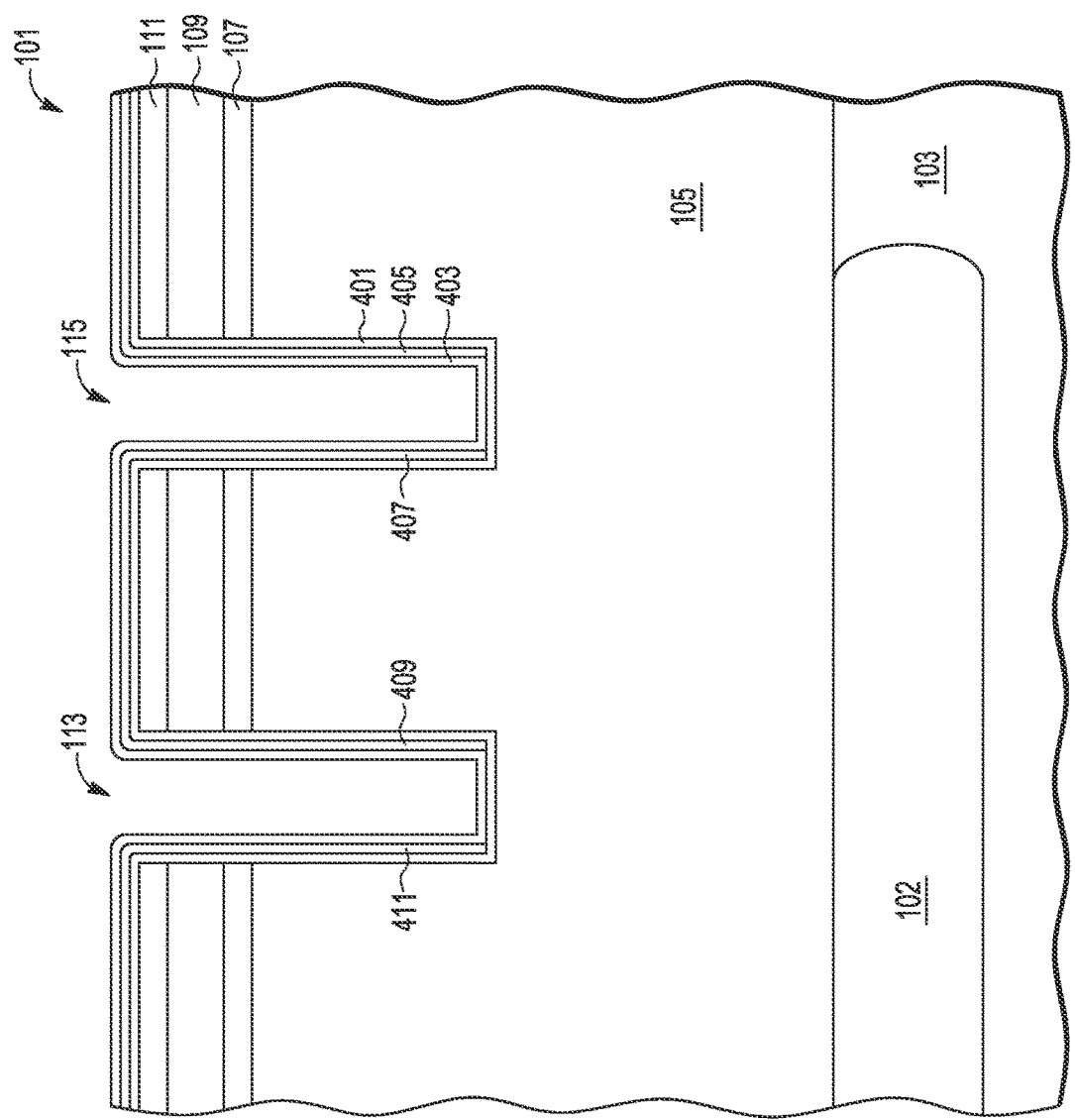

FIG. 4 is a partial cutaway side view of wafer 101 after conformal layers 401 and 403 and nitride spacers 411, 409, 407, and 405 are formed on wafer 101. In one embodiment, layers 401 and 403 are formed by depositing layers of oxide on wafer 101. In one embodiment, layers 401 and 403 have a thickness in the range of 100 A-500 A, but may have other thicknesses in other embodiments. After the deposition of layer 401, nitride spacers 411, 409, 407, and 405 are formed on the sidewalls of trenches 113 and 115. In one embodiment, nitride spacer 411, 409, 407 and 405 are formed by depositing a layer of nitride on wafer 101 followed by an anisotropic etch of the layer with an appropriate etch chemistry. In one embodiment, the nitride layer has a thickness of 1000 A, but may be of other thicknesses in other embodiments. Afterwards, layer 403 is deposited on wafer 101.

Figure 5:
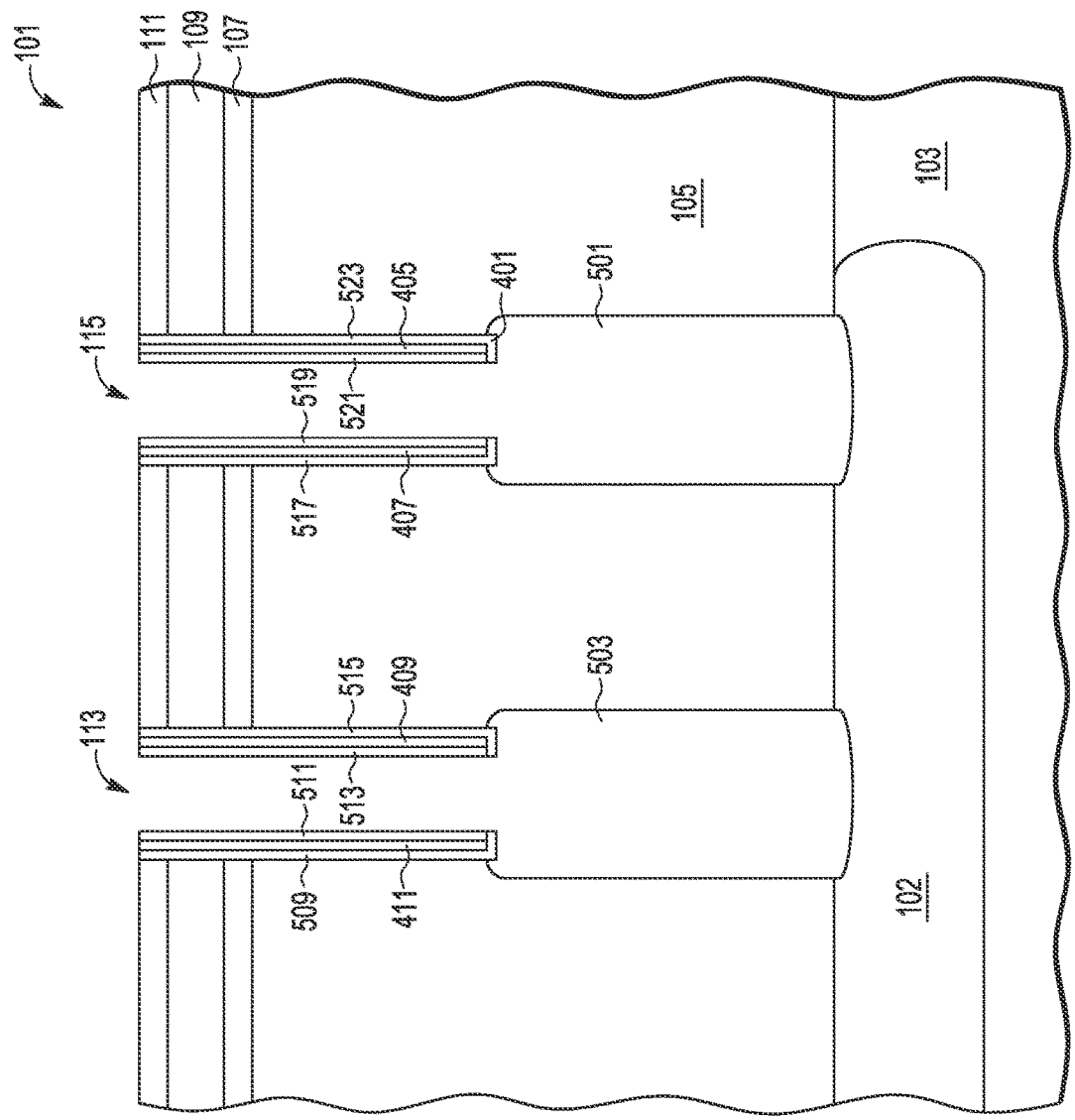

FIG. 5 is a partial cutaway side view of wafer 101 after trenches 503 and 501 are formed by etching substrate 104 through the openings in trenches 113 and 115, respectively. Prior to forming trenches 503 and 501, oxide layer 403 is anisotropically etched to form sidewall spacers, 511, 513, 519, and 521 and oxide layer 401 is anisotropically etched to form sidewall spacers 509, 515, 517, and 523. Trenches 503 and 501 are formed by etching through the openings defined by the sidewall spacers.

In other embodiments, the nitride layer for forming spacers 411, 409, 407, and 405 is etched after layer 403 is etched to form spacers 511, 513, 519, and 521. In other embodiments, spacers are formed for each of layer 401, the nitride spacer layer, and layer 403 prior to the next layer being deposited.

In one embodiment, trenches 503 and 501 are formed by an isotropic etch to initially widen the trench beyond the sidewall of trenches 113 and 115, respectively, followed by an anisotropic etch. In one embodiment, the anisotropic etch with isotropic undercut is performed using reactive ion etching, but the trenches may be formed by other methods in other embodiments. In some embodiments, the isotropic over-etch may be tuned to sufficiently align sidewall surfaces such that top and bottom portion of conductive structures (901) in FIG. 9 do not get disconnected during of subsequent anisotropic etch of the conductive structure material. In the embodiment shown, trenches 503 and 501 are etched to consume a top portion of region 102. In one embodiment, trenches 503 and 501 have a total depth of 4 um and a width of 1.5 um in the lower portion but may have other depths and widths in other embodiments.

Figure 6:
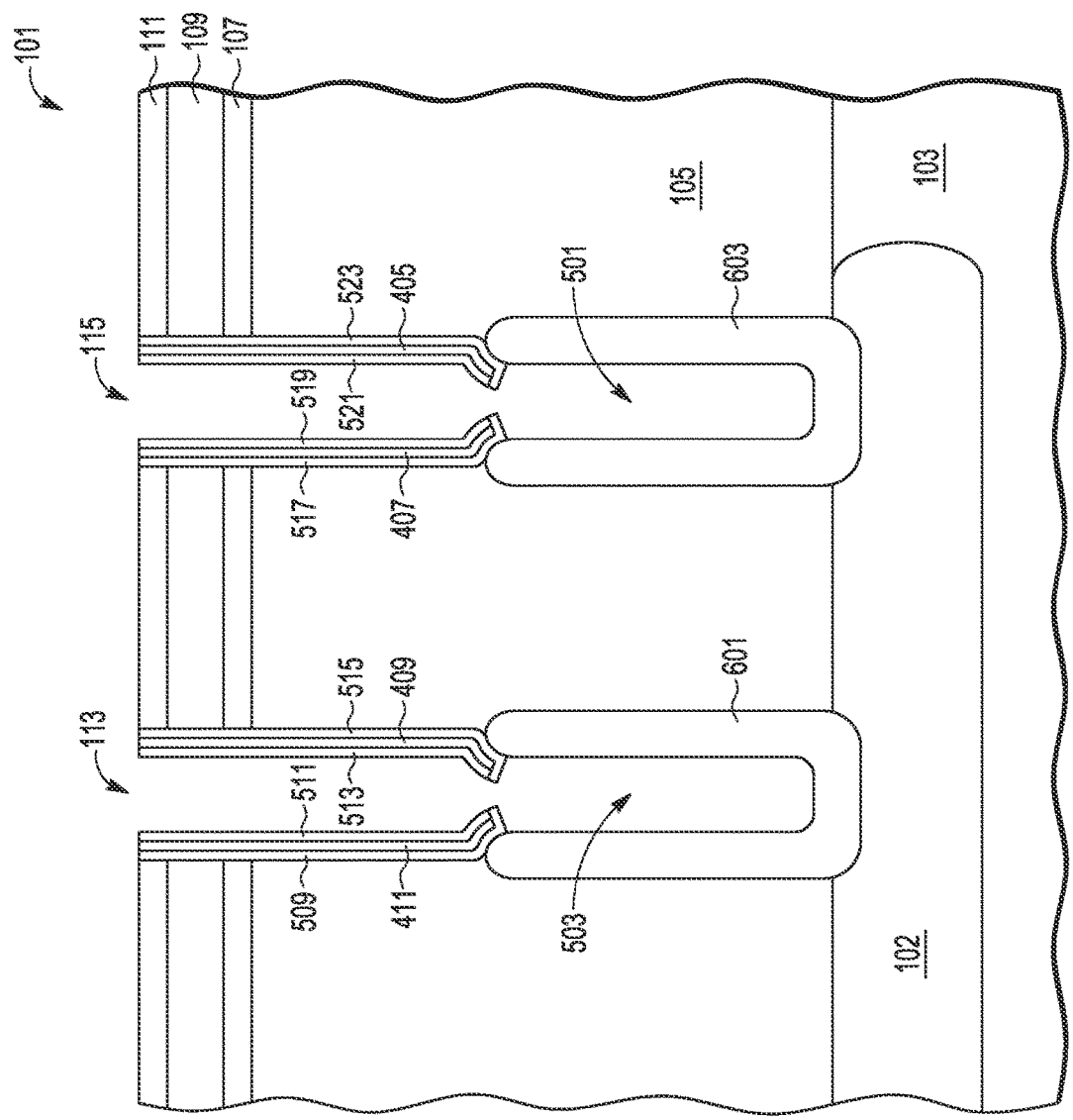

FIG. 6 is a partial cutaway side view of wafer 101 after oxide layers 601 and 603 are formed on the bottom and sidewalls of trenches 503 and 501 respectively. In one embodiment, layers 601 and 603 are formed by an oxidation process. In one embodiment, layers 601 and 603 have a thickness in the range of 0.25 um, but may have other thicknesses in other embodiments.

In the embodiment shown, sidewall spacers 509, 411, 511, 513, 409, 515, 517, 407, 519, 521, 409, and 523 generally protect the sidewalls of trenches 113 and 115 from being oxidized during the formation of layers 601 and 603. However, in the embodiment shown, the bottom portions of the sidewalls spacers may bend inward by the oxidation in the undercut region.

Figure 7:
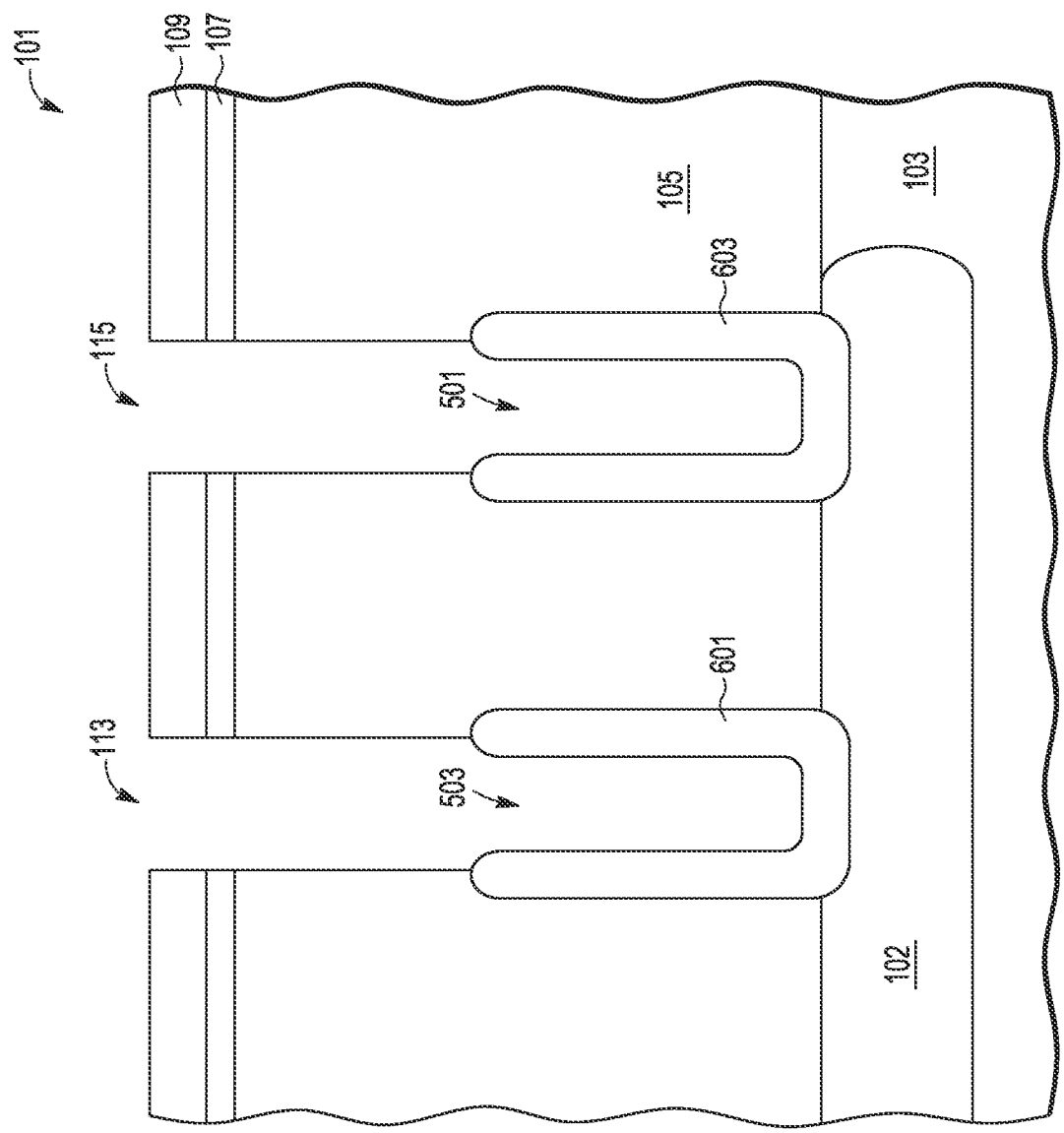

FIG. 7 is a partial cutaway side view of wafer 101 after sidewall spacers 509, 411, 511, 513, 409, 515, 517, 407, 519, 521, 409, and 523 are removed. In one embodiment, these spacers are removed by isotopically etching the spacers with the appropriate etch chemistries. In the embodiment shown, the isotropic etching of the silicon oxide spacers (e.g. 509, 511) also removes layer 111. In addition, the etching of the spacers also removes a relatively thin portion of layer 601 and 603.

Figure 8:
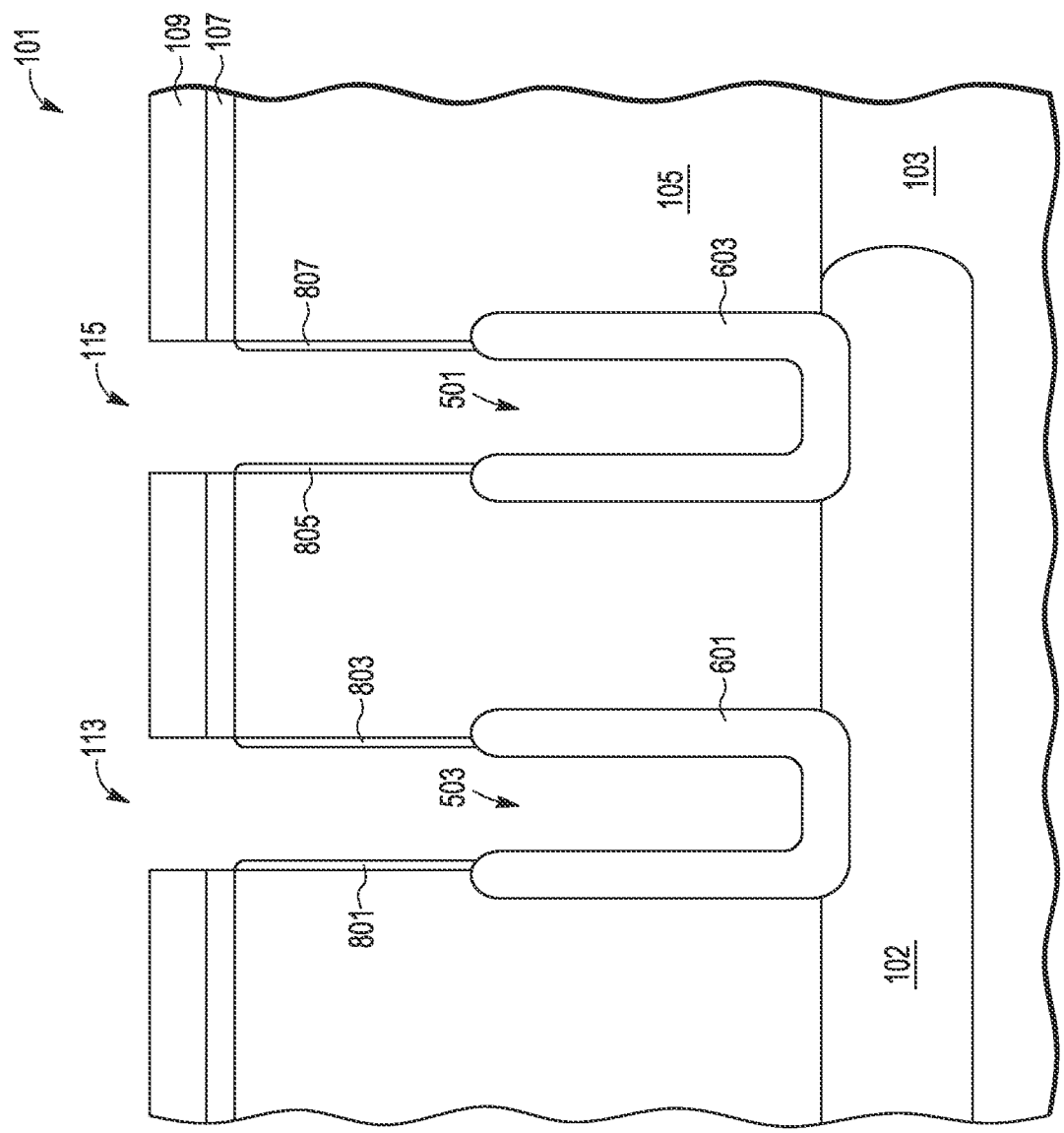

FIG. 8 is a partial cutaway side view of wafer 101 after layers 801, 803, 805, and 807 of oxide are formed on the sidewalls of trenches 113 and 115. These layers will be utilized as gate dielectrics for subsequently formed transistors. In one embodiment, layers 801, 803, 805, and 807 have a thickness in the range of 100 A to 800 A, but may have other thicknesses in other embodiments. Also, in other embodiments, the gate dielectric layers can be formed by a deposition process where the layer is also deposited on layers 601 and 603. Also, in other embodiments, the gate dielectric can be made of other dielectric material.

Figure 9:
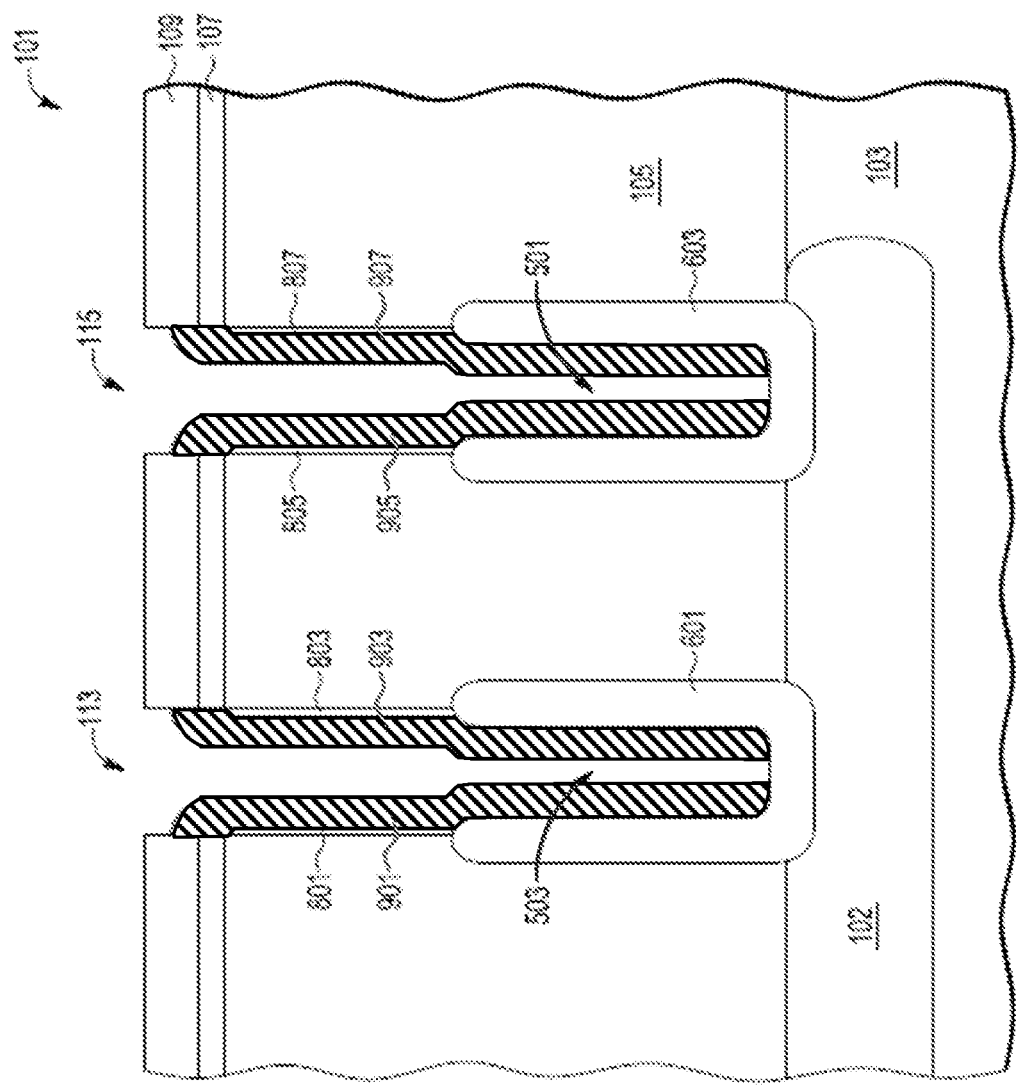

FIG. 9 is a partial cutaway side view of wafer 101 after conductive plate structures 901 and 903 are formed in trenches 113 and 503 and conductive plates structures 905 and 907 are formed in trenches 115 and 501. In one embodiment, plate structures 901, 903, 905, and 907 are formed by depositing a layer of conductive material (e.g. doped polysilicon) over wafer 101 and then anisotropically etching the layer. In some embodiments, the isotropic over-etch during trench etch (FIG. 5) may be adjusted to reduce the step in the conductive layer to prevent separation of top and bottom portion during the anisotropic etch. In one embodiment, the conductive layer is made of doped polysilicon, but may be of other conductive materials in other embodiments. In one embodiment, the conductive layer is formed by chemical vapor deposition process and has a thickness of about 0.20 um, but may be formed by other methods and/or have other thicknesses in other embodiments.

In one embodiment where the conductive layer of the plate structures is polysilicon, the layer is anisotropically etched with an etch chemistry of HBr/Cl2 to separate the plate structures in the trench and to remove the plate material outside of the trenches. In one embodiment, the etch chemistry is selective to the polysilicon and not to the oxide of layers 601 and 603.

Figure 10:
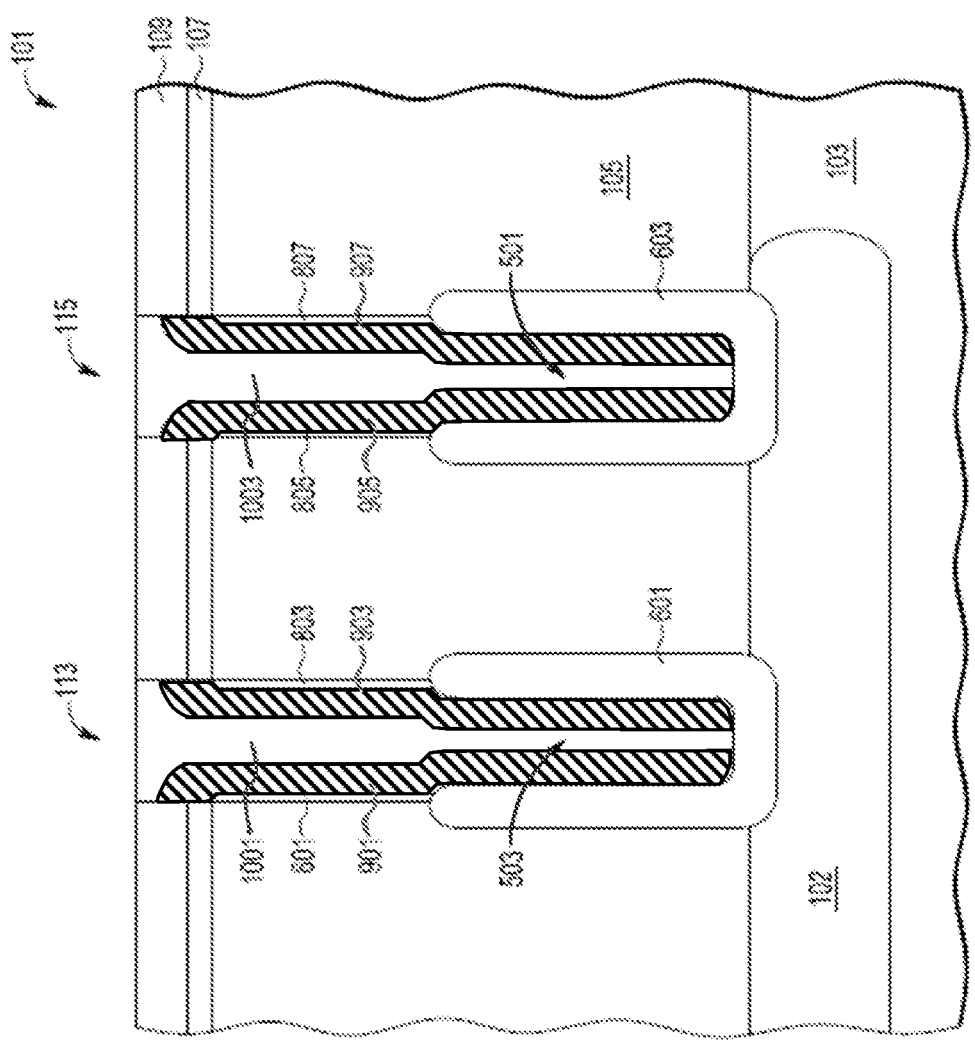

FIG. 10 is a partial cutaway side view of wafer 101 after dielectric material is deposited over wafer 101 including in the trenches (113, 115, 501, and 503). In one embodiment, the layer of dielectric material is silicon oxide, but maybe be made of other dielectrics in other embodiments. After the layer of dielectric material is deposited on wafer 101, wafer 101 is planarized using layer 109 as a planarization stop to form dielectric structures 1001 and 1003. In other embodiments, other types of dielectrics (e.g. nitride, air) maybe located in the trenches between plate structures 901, 903, 905, and 907.

Figure 11:
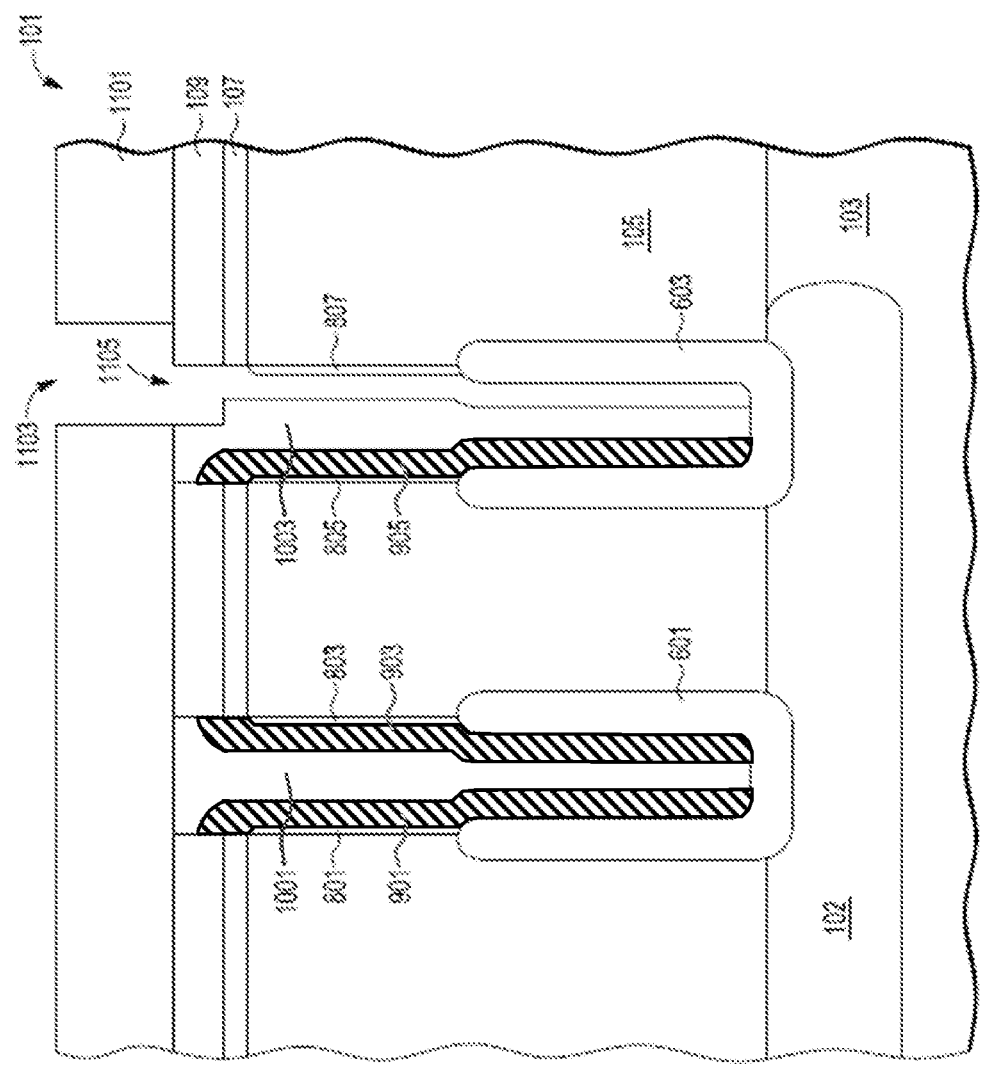

FIG. 11 is a partial cutaway side view of wafer 101 after conducive plate structure 907 is removed by etching through an opening 1103 in mask 1101 to form opening 1105 in wafer 101. In one embodiment, structure 907 is removed by first removing the oxide of dielectric structure 1003 on top of structure 907 with an anisotropic etch and then removing structure 907 with a highly selective isotropic polysilicon etch, e.g. SF6 plasma.

Figure 12:
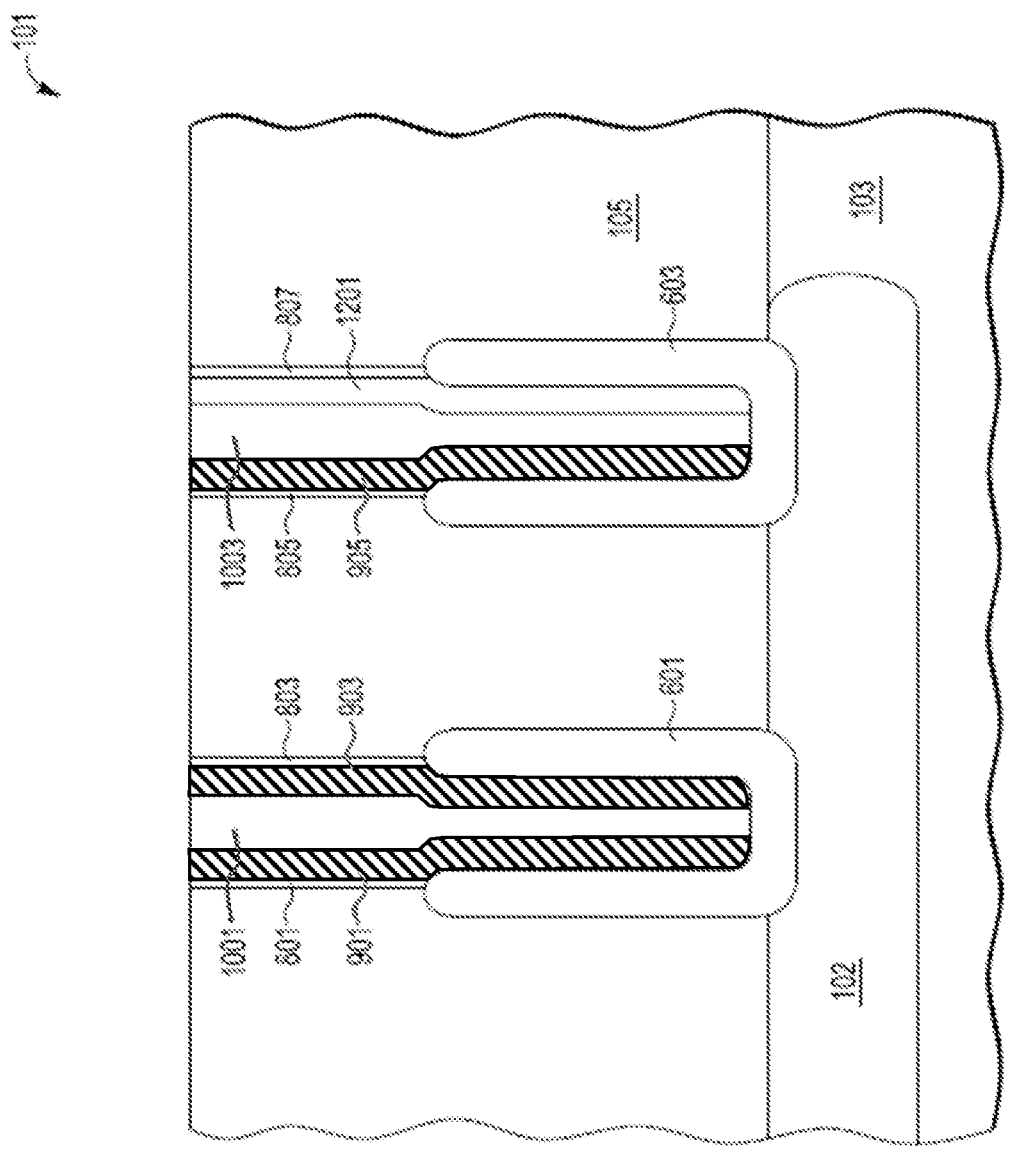

FIG. 12 is a partial cutaway side view of wafer 101 after dielectric structure 1201 is formed in opening 1105 and layers 109 and 107 are removed. In one embodiment, structure 1201 is made of silicon oxide, but may be made of other materials. In one embodiment, structure 1201 is formed by depositing a layer of dielectric material over wafer 101 and then planarizing wafer 101. In one embodiment, the planarization also removes layers 109 and 107. In another embodiment, the planarization may utilize nitride layer 109 as an etch stop layer, followed by subsequent etching processes to remove layers 109 and 107. In some embodiments after the removal of layers 109 and 107, conductive plate structures 901, 903, 905 are recessed as needed. In some embodiments, a subsequent poly-re-oxidation may be performed to seal the polysilicon and to form a screen oxide for subsequent implantation steps.

In other embodiments, other types of dielectrics may be formed in opening 1105. For example, the opening 1105 may be sealed to form an air gap. In one embodiment, opening 1105 would be formed after the removal of nitride layer 109.

Figure 13:
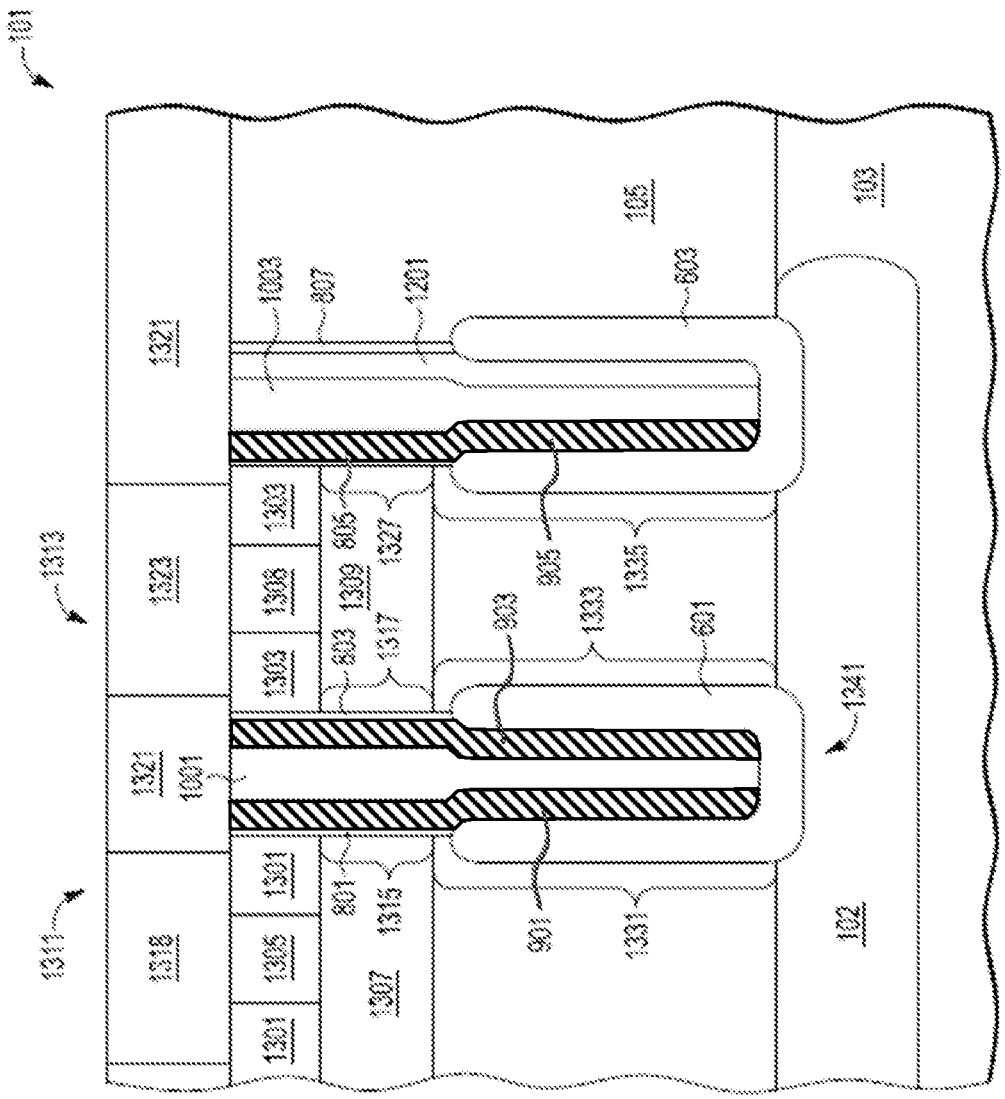

FIG. 13 is a partial cutaway side view of wafer 101 after P-well regions 1307 and 1309 are formed in layer 105 by the ion implantation of P-type dopants (e.g. boron) into layer 105. In one embodiment, boron is implanted at an energy of 180 keV and dosage of $1.2e13$ cm$^{-2}$, but may be implanted at other energies and/or other dosages in other embodiments. In one embodiment, implantation is followed by an annealing step.

Afterwards, source regions 1301 and 1303 and body contact regions 1305 and 1308 are formed by the selective implantation of N type dopants and P-type dopants into P-well regions 1307 and 1309, respectively. The N-type dopant ions are implanted through a patterned implant mask (not shown) formed on wafer 101. In one embodiment, arsenic ions at a dose of $5e15$ cm$^{-2}$ are implanted at 120 keV, and phosphorus ions at a dose of $1.5e15$ cm$^{-2}$ are implanted at 55 keV. Other N-type dopants may be implanted at other doses and/or at other energies in other embodiments. Furthermore, in this exemplary embodiment, boron ions are implanted through a designated patterned implant mask (not shown) formed on wafer 101 with a dose of $1.5e15$ cm$^{-2}$ and energy of 25 keV to form body contact regions 1305 and 1308. Implantation is followed by an annealing step, e.g. rapid thermal annealing (RTA).

After the formation of source regions 1301 and 1303 and body contact regions 1305 and 1308, a layer 1321 of interlevel dielectric material is formed on wafer 101. In one embodiment, layer 1321 is an oxide formed by a TEOS process, but may be of another material in other embodiments. Openings are then formed in layer 1321 for the formation of metal contacts to electrically contact the transistor structures. In the embodiment shown, contact 1319 contacts both source region 1301 and contact region 1305. Contact 1323 contacts both source region 1303 and body contact region 1308. In other embodiments, the source regions and body contact regions may have different contacts to be individually biased at different voltages. Not shown in the partial cutaway view of FIG. 13 are contacts for conductive plate structures 901, 903, and 905. These contacts are located outside of the cutaway view of FIG. 13. In some embodiments, substrate 104 can be biased by a contact (not shown) contacting a P-type sinker region (not shown) located outside of termination trench 115. In some embodiments, the P-type sinker region may be utilized to isolate the bi-directional transistor device from other devices (not shown) implemented in the same integrated circuit die.

After the stage shown in FIG. 13, other processes may be performed on wafer 101 such as forming additional interconnect layers. For example, interconnects may be formed to electrically couple together structures 903 and 905. Afterwards, external terminals e.g. bond pads are formed on wafer 101. Wafer 101 is then singulated into multiple die where each die includes at least one bi-directional transistor device having structures shown in FIGS. 1-13. Afterwards, the die are packaged in semiconductor packaging material to form integrated circuit packages where they are shipped to end use manufacturers to include in end use products such as automobiles, battery control systems, and industrial equipment. In other embodiments, a transistor device may include other structures and/or may be formed by other processes. Furthermore, additional process steps may be added to form other components on the same die.

When a gate is biased for a transistor to be conductive, an inversion field forms in a channel region along the trench structure sidewall of the P-well region (1307) between the source region (1301) and the portion of layer 105 directly below the well. In the embodiment of FIG. 13, a channel region 1315 for transistor 1311 is located in well region 1307 along the sidewall of trench 113. The portion of conductive structure 901 laterally adjacent to channel region 1315 serves as the gate for transistor 1311. An extended drain region 1331 for transistor 1311 is located below well region 1307. The portion of structure 901 laterally adjacent to region 1331 serves as a field plate for transistor 1311. Channel region 1317 for transistor 1313 is located in well region 1309 along the sidewall of trench 113. The portion of conductive structure 903 laterally adjacent to channel region 1317 serves as the gate for transistor 1313. An extended drain region 1333 for transistor 1311 is located below well region 1309. The portion of structure 903 laterally adjacent to region 1333 serves as a field plate for transistor 1313. Transistor 1313 also includes a channel region 1327 located in well region 1309 along the sidewall of trench 115. The portion of conductive structure 905 laterally adjacent to channel region 1327 also serves as the gate for transistor 1313. An extended drain region 1325 for transistor 1311 is located below well region 1309. The portion of structure 905 laterally adjacent to region 1335 serves as a field plate for transistor 1313. The portion 1341 of substrate 104 below trench 503 is utilized as a shared drain between transistor 1311 and 1313. In one embodiment, the channel regions shown in FIG. 13 are characterized as vertical channel regions.

Figure 14:
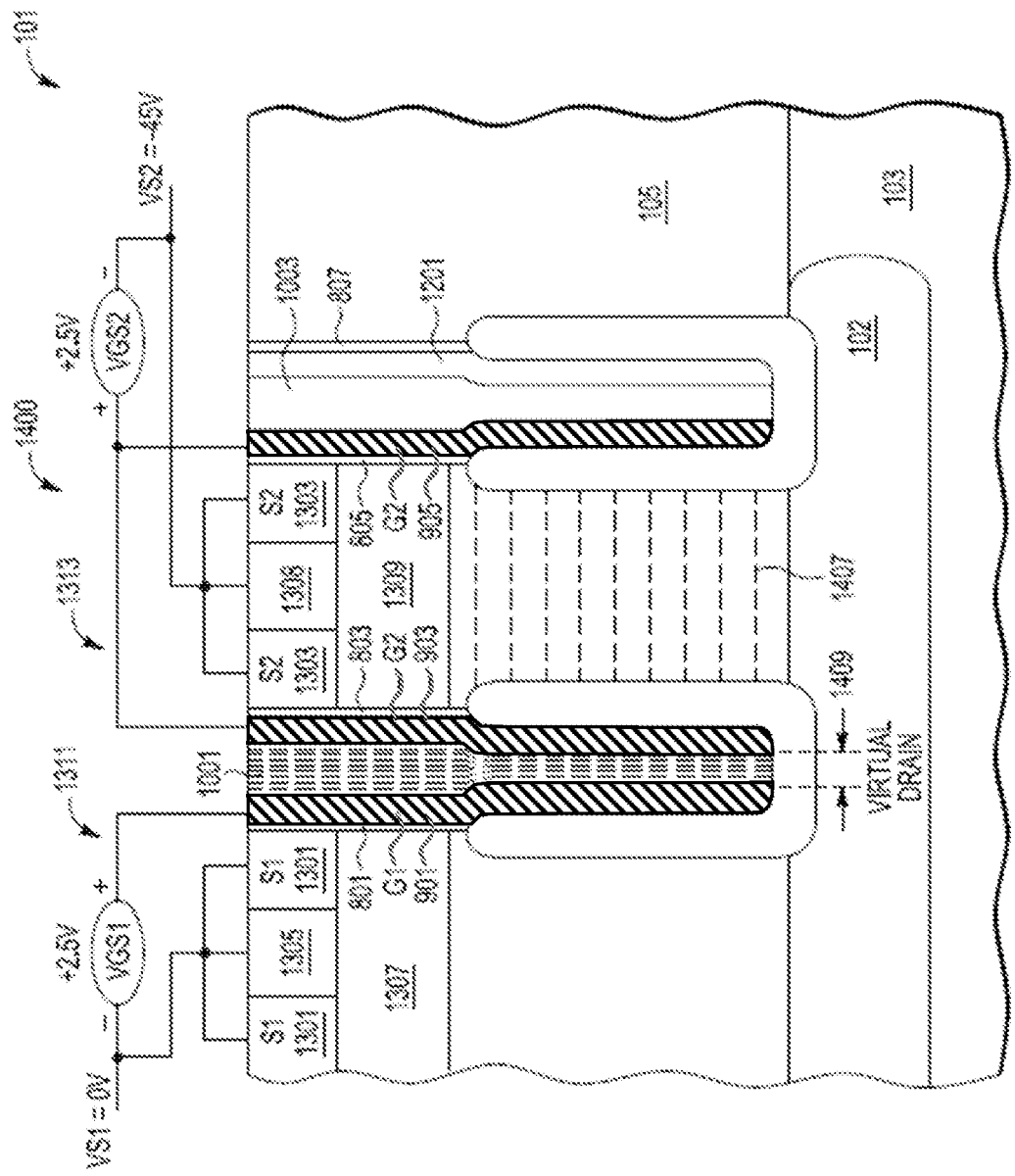
FIG. 14 is a partial side view illustration showing potential fields and the electrical coupling of a transistor device during an operating condition according to one embodiment of the present invention.

FIG. 14 is a partial side view of the transistors 1311 and 1313 formed in the area shown in FIGS. 2 and 3 and whose stages of manufacture are shown in the cross sections of FIGS. 1 and 4-13. The transistors are configured in a back-to-back configuration to implement a bi-directional device 1400. The view of FIG. 14 shows voltages applied to the transistor structures during one operating condition and some of the equipotential field lines generated from the electrostatic fields when device 1400 is in the particular operating condition. Note that not all the equipotential field lines of the electrostatic fields generated from the operating condition are shown in FIG. 14.

In the embodiment shown, conductive plate structures 903 and 905 are electrically coupled together to be at same potential during operation. In one embodiment, structures 903 and 905 each includes a contact (not shown) that is electrically coupled together in an interconnect layer. Plate structures 903 and 905 form the gate for transistor 1313 (having the source regions implemented in area S2 of FIGS. 2 and 3) of the back-to-back transistor configuration (see FIG. 15). Plate structure 901 forms the gate for the other transistor of the back-to-back transistor configuration, which has the source regions implemented in area S1 of FIGS. 2 and 3 (see FIG. 15).

In the embodiment shown, both transistors are in a conductive state. Plate structures 903 and 905 are biased at 2.5 volts higher (−42.5 Volts) than source region 1303 (which is biased at −45 Volts) such that an inversion region forms in channel regions 1317 and 1327 along the sidewalls of trenches 113 and 115 adjacent to structures 903 and 905, respectively. In the embodiment shown, source region 1301 is biased at 0 Volts. Structure 901 are biased at 2.5 Volts such that that transistor 1311 is conductive as well.

As shown in FIG. 14, a potential difference exists between source region 1303 (biased at −45 Volts) and substrate layer 103 (biased as 0 Volts). Because plate structures 903 and 907 are biased at the gate voltages, the voltage difference between source region 1303 and substrate layer 103 can be supported along the length of the trenches towards region 102. See equipotential lines 1407 in FIG. 14. In some embodiments, the field plate portions of the conductive plate structures 901, 903, and 905 provide a RESURF effect and assist in depleting the semiconductor region between the trenches such that the potential drop is distributed vertically between well regions 1307 and 1309 and region 102. Employing the field plates in this manner allows for increased BV. Alternatively, the field plates may allow for a higher N-type net doping concentration in layer 105 below the P-wells to reduce the RonA while maintaining the breakdown voltage of the device within acceptable ranges for the intended application. It should be appreciated that the depth of the trench, the depth and doping concentration of layer 105, the trench spacing, the width of the semiconductor region, as well as the field oxide thicknesses of layers 601 and 603 may be balanced for optimal performance.

In other embodiments, other voltages may be applied to the source regions in other applications. For example, source region 1301 may be biased at a negative voltage (e.g. −45 Volts) or at a positive voltage (+45 Volts). Source region 1303 may be biased at ground (0 Volts) or at a positive voltage. These voltages may be applied when the device is conductive or nonconductive. Accordingly, the bi-directional device shown in FIG. 14 can be implemented in both a forward biased application or a reversed biased application. In other embodiments, a bi-directional transistor device maybe designed to operate with greater magnitude voltages (e.g. ±130 Volts) or lessor magnitude voltages (e.g. ±30 Volts) being applied to its structures. In these voltages, certain parameters such as e.g. trench width, trench depth, trench spacing, and drain doping levels may be adjusted to provide a device with higher breakdown voltages or lower breakdown voltages as needed or to optimize performance.

In the embodiment shown, the heavy N type doping of region 102 provides for improved symmetry in electrical characteristics between the forward and reverse bias directions of the bi-directional device and also reduces the RonA of the device. In the embodiment shown, because the heavier doping of region 102 is located at the bottom of a trench and not along the sidewall of the trench where voltage dissipation occurs (see equipotential lines 1407), the RonA resistance can be reduced without decreasing the breakdown voltage of the bidirectional device. In one embodiment, the bi-directional device 1400 has a breakdown voltage of +/−60 Volts with a RonA of 41 mOhmmm$^2$, however other devices may have other values for these parameters in other embodiments.

In other embodiments, region 102 would not be heavily doped but instead would have the same net conductivity as the portion of layer 105 below the P-well regions 1307 and 1309. In one such embodiment, a bi-directional device with this configuration may have a forward breakdown voltage of 64 Volts, a reverse breakdown voltage of 63 Volts, and a RonA of 51 mOhmmm$^2$. However, these parameters may be of other values in other embodiments.

In some embodiments, the N-type net conductivity concentration in layer 105 directly below P-well region 1309 (in the S2 area of FIGS. 2 and 3) and the N-type net conductivity concentration in layer 105 directly below P-well region 1307 are different from each other to optimize RonA for asymmetrical breakdown voltage targets. A lower BV requirement in one operating direction may allow for increased doping concentration in S1 or S2 regions for improved total RonA.

Also shown in FIG. 14 are the equipotential lines representing of the electrostatic fields within trenches 113 and 503 that occur between plate structures 901 and 903 for the operating condition shown in FIG. 14. In the embodiment shown, structure 903 is biased at −42.5 Volts and structure 901 is biased at 2.5 Volts. This electrostatic field is dissipated in the dielectric structure 1001 that is laterally between plate structures 901 and 903 in trenches 113 and 503. In one embodiment, the lateral distance 1409 between the plate structures 901 and 903 in trench 503 is set to meet the desired breakdown voltage requirements for the bi-directional transistor devices of a particular application. In one embodiment, distance 1419 is about 0.5 um, but may be other distances in other embodiments. The distance 1419 is also dependent on the type of dielectric between the plate structures.

Each plate structure 901, 903, and 905 is separated vertically from the bottom of the trenches 503 and 501 by the thickness of layers 601 and 603. In some embodiments, the thickness of layers 601 and 603 can be adjusted for optimal performance. In yet another embodiment, the thicknesses of layers 601 and 603 may be increased at the bottom of the trenches.

As shown in FIG. 14, the drain region for both transistors 1311 and 1313 is characterized as a "virtual drain" in that it is not biased at a particular voltage with a direct external contact and it is an internal node of a bi-directional device which can be characterized as drain connected back-to-back transistors. In one embodiment, the virtual drain includes portions of region 102 directionally below and adjacent to a trench (503) and portions of layer 105 forming extended drain regions directly below P-well regions 1307 and 1309 located along the sidewalls of a trench.

In the embodiment shown, the substrate layer 103 is biased at a ground voltage. In other embodiments, substrate layer 103 may be biased at the lowest source voltage (e.g. −45 V) to provide more symmetry in the forward and reverse biased conditions.

In some embodiments, providing a trench with two conductive structures that serve as field plate structures may enable a bi-directional device to occupy less integrated surface area and provide for a lower RonA. If a trench were to include only one field plate structure, then there would have to be a spacing between separate gate structures and the single field plate structure for the device to be bidirectional so as to dissipate the electrostatic fields due to the voltage differential to allow the single field plate to be biased at about the high or the low potential depending on blocking direction. Furthermore, the need for sufficient isolation between the separate gates and single field plate structure would constrain optimization of the field oxide thickness between field plate and vertical semiconductor surface. However, with two field plate structures per trench, the gate structure and field plate structure can be implemented with the same structure. Accordingly, by using two field plates, the width of a trench can be reduced, and the field oxide thickness can be more easily optimized. In some embodiments, a narrower trench structure lowers the RonA of the bi-directional device.

Moreover, forming two trenches (e.g. 113 and 503) for the transistors may allow for the control terminal and field plate of the transistor to be implemented with one structure. By forming two trenches (113 and 503) and forming sidewall spacers (411, 409, 407, and 405) on the top trench (113), a single conductive plate can be separated from the semiconductor material of the sidewall by a dielectric by two separate lateral distances. For the control terminal portion of structure 901, structure 901 is laterally separated from the sidewall of trench 113 by the thickness of gate dielectric layer 801. For the majority of the field plate portion of structure 901, structure 901 is laterally separated from the sidewall of trench 503 by layer 601. Since these layers are separately formed, these distances can be independently adjusted based on desired operating characteristics.

In some embodiments, a termination trench (trenches 115 and 501) is included in a bi-directional transistor device to maintain a sufficient a voltage breakdown in the peripheral areas of the device near the termination trench. As shown in the embodiments of FIG. 13, conductive structure 907 and was removed. However, in other embodiments, structure 907 would remain in the trench. In some embodiments, structure 907 would remain and be electrically coupled to system ground (0 Volts) or left floating. In other embodiments, structure 907 would remain and be tied to field plate structure 905.

In some embodiments, the described processes are suitable for producing bi-directional devices with break-down voltages BVdss=+/−60V, or unidirectional devices with BVdss=120V. Trench dimensions and doping concentrations may be scaled to optimize for other target voltages.

Figure 15:
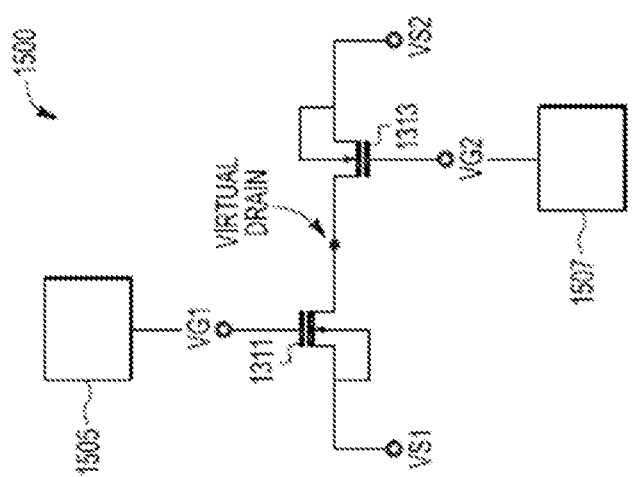
FIG. 15 is a circuit diagram showing back-to-back configured transistors.

FIG. 15 is a circuit diagram of a drain connected back-to-back transistor circuit 1500 that can be utilized as a bi-directional switch. Circuit 1500 includes a first transistor 1311 and a second transistor 1313. Conventionally, transistors 1311 and 1313 would be implemented as separate devices in a circuit as shown. In contrast, embodiments of this invention integrate both FET's 1311 and 1313 into a bidirectional device that share a common drain region as a virtual internal node. In the embodiments of FIGS. 2 and 3, the source and channel regions of transistor 1311 are implemented in the areas designated by S1 and the source and channel regions of transistor 1313 are implemented in the areas designated S2. Driver circuit 1505 controls the gate voltage for the gate of transistor 1501 and driver circuit 1507 controls the gate voltage of the gate of transistor 1503. In one embodiment, circuit 1500 can be utilized as a switch between a node connected to the source of transistor 1501 and a node connected to the source of transistor 1503, regardless of which node is at the higher voltage.

In some embodiments, the gate driver circuits 1505 and 1507 for controlling the voltage of conductive structures 901, 903, and 905 are located on the same integrated circuit as the bi-directional transistor device. However, in other embodiments, the driver circuits may be located on a separate integrated circuit chip.

Figure 16:
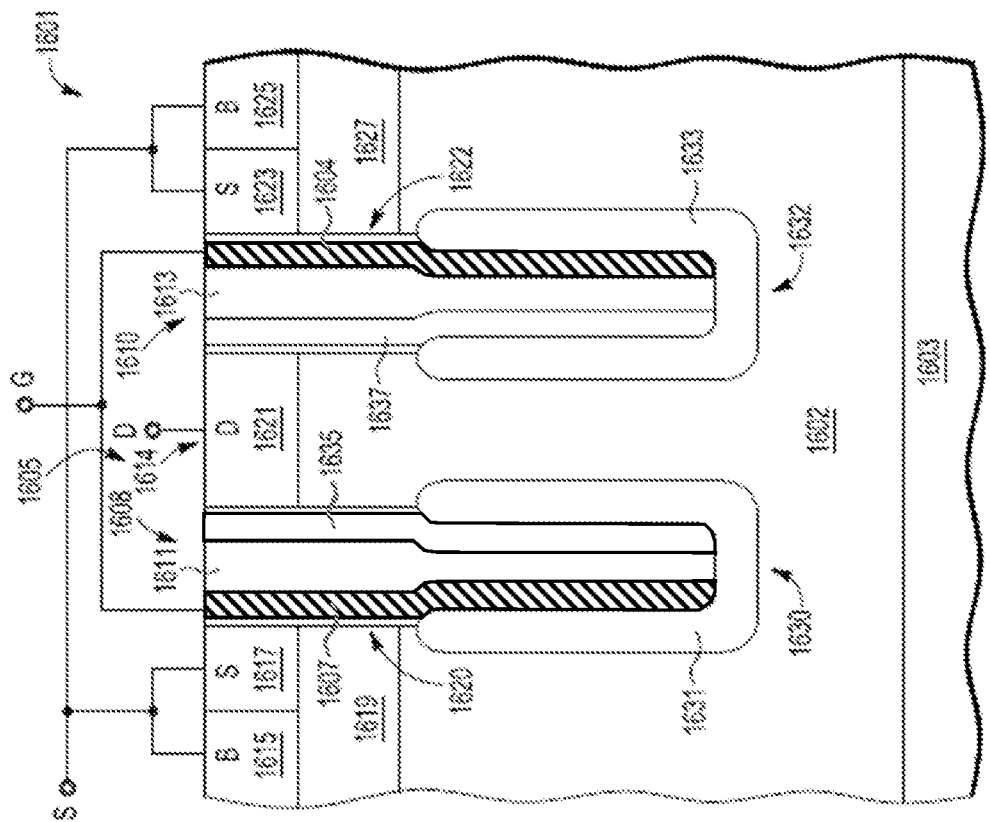
FIG. 16 is a partial cutaway side view of a stage in the manufacture of a transistor device according to another embodiment of the present invention.

FIG. 16 is a partial cross-sectional side view of a wafer 1601 a transistor device according to another embodiment of the present invention. FIG. 16 shows a uni-directional power transistor 1605 located in wafer 1601. Transistor 1605 includes N-type source regions 1617 and 1623 located in P well region 1619 and 1627, respectively, as well as P-type body contact regions 1615 and 1625, respectively. Transistor 1605 includes conductive plate structures 1607 and 1604 that serve as both a gate for transistor 1605 and a field plate. Channel regions 1620 and 1622 are located in P Well regions 1619 and 1627, respectively, along the sidewall of trenches 1608 and 1610, respectively. Region 1621 serves as a drain region for transistor 1605. In one embodiment, source regions 1617 and 1623 and drain region 1621 have a doping concentration in the range of 1e19 cm$^{-3}$ to 1e21 cm$^{-3}$, the body contact regions 1615 and 1625 have a doping concentration in the range of 1e19 cm$^{-3}$ to 1e21 cm$^{-3}$, and P well regions 1619 and 1627 have a doping concentration in the range of 1e16 cm$^{-3}$ to 1e18 cm$^{-3}$. However, these concentrations may be of other values in other embodiments.

In the embodiment shown, transistor 1605 is located in an N-type region 1602 located in a layer of semiconductor material epitaxially formed above a P-type substrate layer 1603. Substrate layer 1603 has an P-type doping concentration in range of 1e14 cm$^{-3}$-1e16 cm$^{-3}$, but may be of other values in other embodiments. In one embodiment, N-type region 1602 has a doping concentration in the range of 5e15 cm$^{-3}$ to 5e17 cm$^{-3}$, but may be of other values in other embodiments. N-type region 1602 serves as an extended drain region for transistor 1605. In some embodiments, region 1602 is formed by implanted dopants in layer 1603.

The majority of the portions of plate structures 1607 and 1604 that act as field plates are laterally separated from the source side sidewalls of trenches 1608 and 1610, respectively, by dielectric layers 1631 and 1633, respectively. This lateral separation distance between the field plates from the source sidewalls is smaller than the lateral separation distance between the field plates from the drain sidewalls of drain pillar 1614. In some embodiments, the different lateral separation distances between the field plates and different trench sidewalls allows for better optimization of the RESURF balance in the drain and source pillars, (i.e. managing the field strength perpendicular to the semiconductor-dielectric interface) since a higher electric field needs to be dissipated across the dielectric between the field plates and the drain pillar 1614 than between field plates and the source pillars.

In one embodiment, conductive plate structures 1607 and 1604 are formed in a similar manner to plate structure 905 as shown in FIG. 13. In the formation of plate structures 1607 and 1604, an additional conductive plate (not shown but similar to plate structure 907 in FIG. 9) is formed in each trench. Those additional plates are removed (see FIG. 11) and dielectric structures 1635 and 1637 are formed in their place. Not shown in FIG. 16 are the interconnect structures located above substrate 1601.

FIG. 17 is a partial top view of wafer 1601 showing the cross-section location of FIG. 16. In the embodiment shown, wafer 1601 includes drain regions 1117, 1621, and 1715 and source regions 1617 and 1623. Wafer 1601 also includes body contact regions 1615 and 1625 along with other body contact regions in source region 1617 and 1623. In the embodiment shown, trenches 1608 and 1610 follow the elongated dumbbell shape of source regions 1617 and 1623, respectively. Not shown in FIG. 17 are the conductive plate structures 1607 and 1604 in trenches 1608 and 1610, respectively. Gate contact areas 1721 located over wafer 1601 contact conductive structure 1607 in trench 1608 and gate contact areas 1723 contact conductive plate structure 1604 in trench 1610. Not shown in FIG. 17 are the contact areas for the source and drain regions.

FIG. 18 shows a partial cross-sectional side view of transistor 1605 during an off-state mode of operation according to one embodiment. In the embodiment shown, conductive plate structures 1607 and 1604 and source regions 1617 and 1623 are each grounded. 120V is applied to drain region 1621.

FIG. 18 shows the equipotential lines 1805 representing of the electrostatic fields of transistor 1605 that occur in region 102. As can be shown in FIG. 18, the electrostatic potential between the higher drain voltages and the lower source voltages (ground) are dissipated in the drain extension region that extends from the drain region 1621, underneath trenches 1608 and 1610, to the P well regions 1619 and 1627 regions, respectively. In one embodiment, the amount of dissipation by transistor 1605 is dependent upon the depth of the trenches (1608 and 1610), the width of the trenches, the field oxide (1631, 1633) thicknesses, the distances between the trenches (1608 and 1610, and the depth and doping concentration of the P well regions 1619 and 1627 and N-type region 1602.

One advantage of utilizing a single gate/field plate structure is that it allows for the trench to be narrower allowing for greater device density.

In the embodiment of FIGS. 16-18, the conductive plate structures 1607 and 1604 are closer to the source side of the trenches 1608 and 1610, respectively, than the drain side of the trenches. Accordingly, there is a greater amount of dielectric between the conductive plate structures 1607 and 1604 and the higher voltage drain region 1621. This increased dielectric thickness between the conductive plate structures 1607 and 1604 and the drain region 1621 may provide for a greater amount of electrostatic potential dissipation by the dielectric in trenches (1608 and 1610) from the conductive plate structure (1607 and 1604), thereby raising the breakdown voltage in those areas. In some embodiments, since the trench width at the surface can be smaller, this device may be scalable to lower voltages than with devices having separate gate/field plate structures, e.g. for a 30V device. Also, a device with a single gate/field plate structure may have a simpler contact to conductive structure coupling.

In some embodiments, transistor 1605 can be used as power switches or high voltage analog devices. In other embodiments, transistor 1605 may be formed by different processes, have different structures, and/or have different configurations. If example, the body contact regions 1615 and 1625 may be separately biased from source regions 167 and 1625. In some embodiments, the conductive plates (e.g. 905) may include portions located outside of a trench.

Although the transistors described above are NFETs, the processes shown and described above can be used to make PFETs as well by switching the net conductivity type of at least some of the semiconductor regions. They may also be used to make other types of transistors in other embodiments.

FIGS. 19A, 19B, 20A, 20B, 21A, 21B, 22, 23A, 23B, and 24 depict additional embodiments of the inventive subject matter, including transistor devices with termination regions. In various embodiments, termination regions may increase breakdown voltage and serve to electrically isolate transistor devices from other transistor devices or components.

Figure 19A:
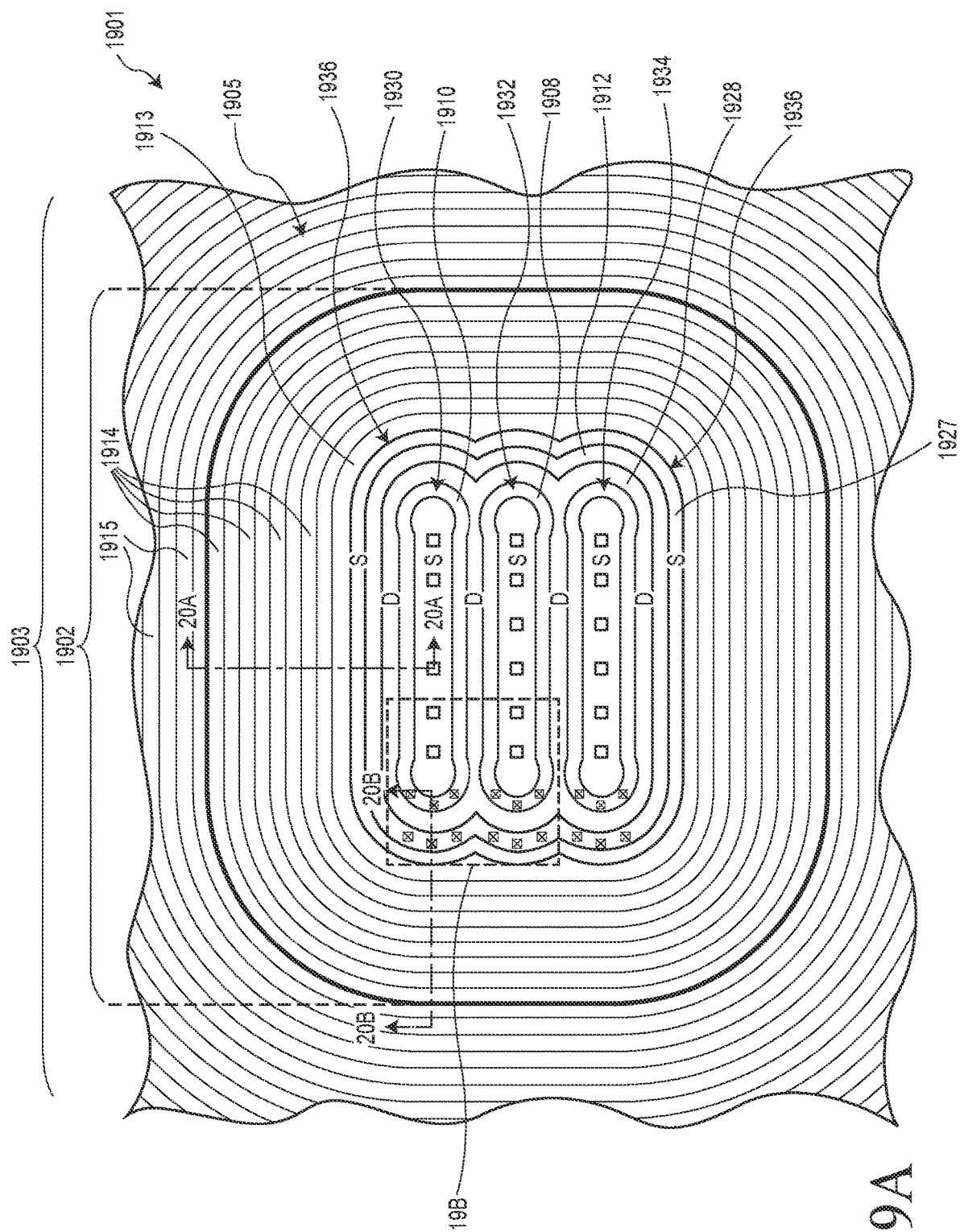
FIGS. 19A-19B sets forth a partial top view of a transistor device according to another embodiment of the present invention.
Figure 19B:
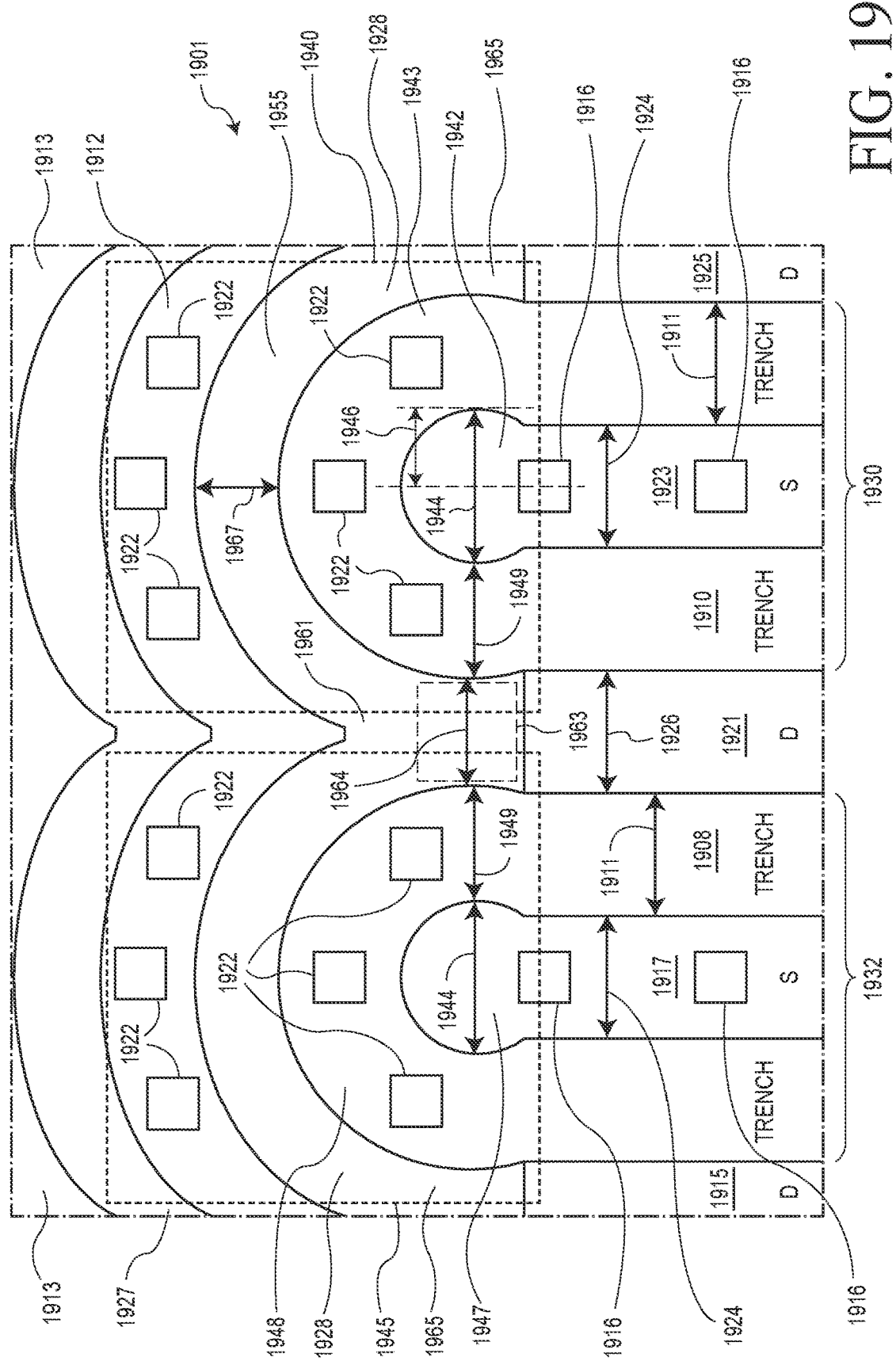

FIGS. 19A-19B set forth partial top views of a transistor device 1905 with termination structures integrated into wafer 1901, according to another embodiment of the present invention. In an embodiment, wafer 1901 and transistor device 1905 may include substrate 1903, and transistors 1930, 1932, 1934 that may be formed over and within substrate 1903 and doped region 1902. Transistors 1930, 1932, 1934 may be surrounded by exterior transistor 1936, according to an embodiment. Exterior transistor 1936 may be surrounded by additional isolation termination trenches 1914, 19151925 and source regions 1917 and 1923 (generally, "current-carrying regions"). Source regions 1917, 1923 and drain regions 1915, 1921, 1925 may be separated and defined by trenches 1908 and 1910 and may be used, in part, to form termination regions 1940 and 1945 at the ends of transistors 1930, 1932. Not shown in FIGS. 19A-19B are conductive structures, e.g. 2037, 2038 of FIGS. 20A and 20B in trenches 1910 and 1912, respectively. Gate contact areas 1922 contact conductive structure 2037 in trench 1910 and contact conductive structure 2038 in trench 1912 in the embodiment shown (not shown in FIG. 19B).

In an embodiment, first and source regions 1917 and 1923 may be formed within the wafer 1901 using ion implantation, epitaxial growth, or other suitable means. Source regions 1917 and 1923 may have a source lateral width (generally, "first lateral width") 1924, also denoted $W_{SA}$, according to an embodiment. In an embodiment, the source lateral width 1924, $W_{SA}$, may take values between about 0.2 microns and about 5.0 microns, though other larger or smaller values may be used. In the embodiment shown and, similar to FIG. 17, trenches 1908, 1910 are formed in substrate 1903 and follow an elongated dumbbell shape of source regions 1917 and 1923, respectively. In an embodiment, trenches 1908, 1910, and 1912 may have a trench width 1911 that may take values between about 0.2 microns and about 5.0 microns, though other larger or smaller values may be used. As will be described hereafter, the enlarged source termination regions 1942, 1947 formed at the ends of source regions 1917 and 1923 partially form termination regions 1940 and 1945. Drain regions 1915, 1921, and 1925 may be formed in the wafer 1901 adjacent the exterior portions of the trenches 1908 and 1910, according to an embodiment. In the embodiment shown, drain region 1921 has a drain lateral width (generally, "second lateral width") 1926, also denoted $W_{DA}$, and is shared between neighboring transistors 1930, 1932. In an embodiment, the drain lateral width 1926, $W_{DA}$, may take values between about 0.2 microns and about 5.0 microns, though other larger or smaller values may be used. In an embodiment, P-type body contacts 1916 are formed withing the source regions 1917 and 1923. In the embodiment shown, P-type body contacts 1916 are formed in multiple regions along the source regions 1917 and 1923. In other embodiments, P-type body contacts may be formed as a single continuous longitudinally along the center portion of source regions 1917 and 1923 (not shown). In other embodiments (not shown), contacts to drain regions 1915, 1921, 1925 may include vias and contact regions, positioned along drain regions 1915, 1921, 1925.

In an embodiment, and as shown in the top-down view of FIG. 19A and side-view of FIG. 19B, exterior transistor 1936 may be formed within wafer 1901 and over substrate 1903. Exterior transistor 1936 may be formed adjacent to and surrounding transistors 1930, 1932,1934. Exterior transistor 1936 may include exterior trench 1912 (generally, "first exterior trench"), exterior source region 1927, and exterior drain region 1928, according to an embodiment. In an embodiment and, in the enlarged view of FIG. 19B, exterior drain region 1928 may be contiguous with drain regions, e.g. 1915, 1921, 1925, of transistors 1930, 1932, and as will be discussed hereafter, may be used to form termination regions 1940, 1942. Exterior trench 1912 may define the outer boundary of exterior drain region 1928 and may be used to form a portion of termination regions 1940, 1945.

As in the embodiment shown, termination regions 1940, 1945 may be formed within wafer 1901 and may include source termination regions 1942, 1947, drain termination regions 1955,1965, shared drain termination region 1961, trench termination regions 1943, 1948, and trench 1912 of exterior transistor 1936 (generally, "termination portions"). In an embodiment, source termination regions 1942, 1947 may be formed inside and conformally patterned along trench termination regions, 1943 and 1948. Drain termination regions 1955, 1965, and shared drain termination region 1961 may be formed in wafer 1901 as part of drain region 1928 of exterior transistor 1936 between trench termination regions 1943, 1948 and exterior trench termination region 1912, according to an embodiment. Termination regions 1940, 1945 may be electrically coupled to source regions 1917, 1923, trenches 1908, 1910, drain regions 1915, 1921, 1925, as in the embodiment shown.

The enlarged source termination regions 1942, 1947 may be characterized by a partially circular shape with a source termination region width (generally, "termination portion width") 1944, also denoted $W_{SB}$, such that the radius of curvature 1946, denoted R, of the circular portion of the source termination region would be $W_{SB}/2$ in accordance with an embodiment. In other embodiments, non-circular shapes may be used (not shown). In an embodiment, source termination region width 1944, $W_{SB}$ may relate to source lateral width 1924, $W_{SA}$, such that source termination region width 1944 may have minimum width of approximately the same value as source lateral width 1924 and may have a maximum value of approximately two times the value of the source lateral width 1924. Other larger or smaller values may be used for source termination width 1944 in other embodiments. Similarly, the radius of curvature 1946, R may have values of between approximately 0.5 times the source lateral width 1924 and approximately 1.0 times the full source lateral width 1924, $W_{SA}$, according to an embodiment. In other embodiments, larger or smaller values for the radius of curvature 1946 may be used.

Choke region 1963 may be defined by a portion of shared drain termination region 1961, between adjacent termination trenches 1908, 1910 in a region where termination trenches 1908, 1910 have a minimum lateral distance between them. In an embodiment, the minimum lateral distance between adjacent termination trenches 1908, 1910 may be characterized by a choke region distance 1964, denoted $W_C$. In an embodiment, choke region distance 1964 may be approximately equal to or smaller than drain lateral width 1926, wherein choke region distance 1964 may be between approximately 0.3 times the value of drain lateral width 1926 and approximately 0.7 times the value of drain lateral width 126, though other larger or smaller values may be used.

The trench termination regions 1943, 1948 may have a generally semicircular or horseshoe shape and may follow the shape of the source termination regions 1942, 1947, as in the embodiment shown. In an embodiment, trench termination regions 1943, 1948 may have a trench termination region lateral width 1949, also denoted as $W_{trB}$, that is approximately the same width as trench width 1911, also denoted as $W_{trA}$. In other embodiments (not shown), trench termination regions 1943, 1948 may have a trench termination lateral width 1949 that has values that are more or less than trench width 1911. In an embodiment, trench termination lateral width 1949 may be in a range between about 0.2 microns and about 5.0 microns although other larger or smaller values may be used.

Drain termination regions 1955,1961, 1965 may be formed in wafer 1901 as part of drain region 1928 of exterior transistor 1936 between trench termination regions 1943, 1948 and exterior trench 1912, according to an embodiment. In an embodiment, drain termination regions 1955, 1961, 1965 are defined by edges of exterior trench 1912. In an embodiment, a drain termination distance 1967 (generally, "exterior distance") is less than drain lateral width 1926. Drain termination distance 1967, also denoted $W_{DB}$, may have a value of between about 0.5 times drain lateral width 1926 to about 0.9 times the value of drain lateral width 1926, though other larger or smaller values may be used, according to an embodiment.

In an embodiment, the breakdown voltage of transistor device 1905 may be maximized by increasing the source termination radius of curvature 1946, $R=W_{SB}/2$, and optimizing the values of choke region distance 1964, $W_C$. In an embodiment, choke region distance 1964, $W_C$, may be greater than a minimum value, $W_{min}$, determined by manufacturability or other constraints. In an embodiment, choke region distance 1964, $W_C$, may relate to values for source lateral width 1924, $W_{SA}$, drain lateral width 1926, $W_{DA}$, trench lateral width 1911, $W_{trA}$, source termination width 1944, $W_{SB}$, and termination trench width 1949, $W_{trB}$, according to the relationship, $W_c = W_{DA} + W_{SA} + 2W_{trA} - W_{SB} - 2W_{trB} \geq W_{min}$. The minimum value, $W_{min}$, of choke region distance 1964, $W_{min}$, may take values of between about 0.2 microns and 1.0 microns, though other larger or smaller values may be used, according to an embodiment.

Figure 20A:
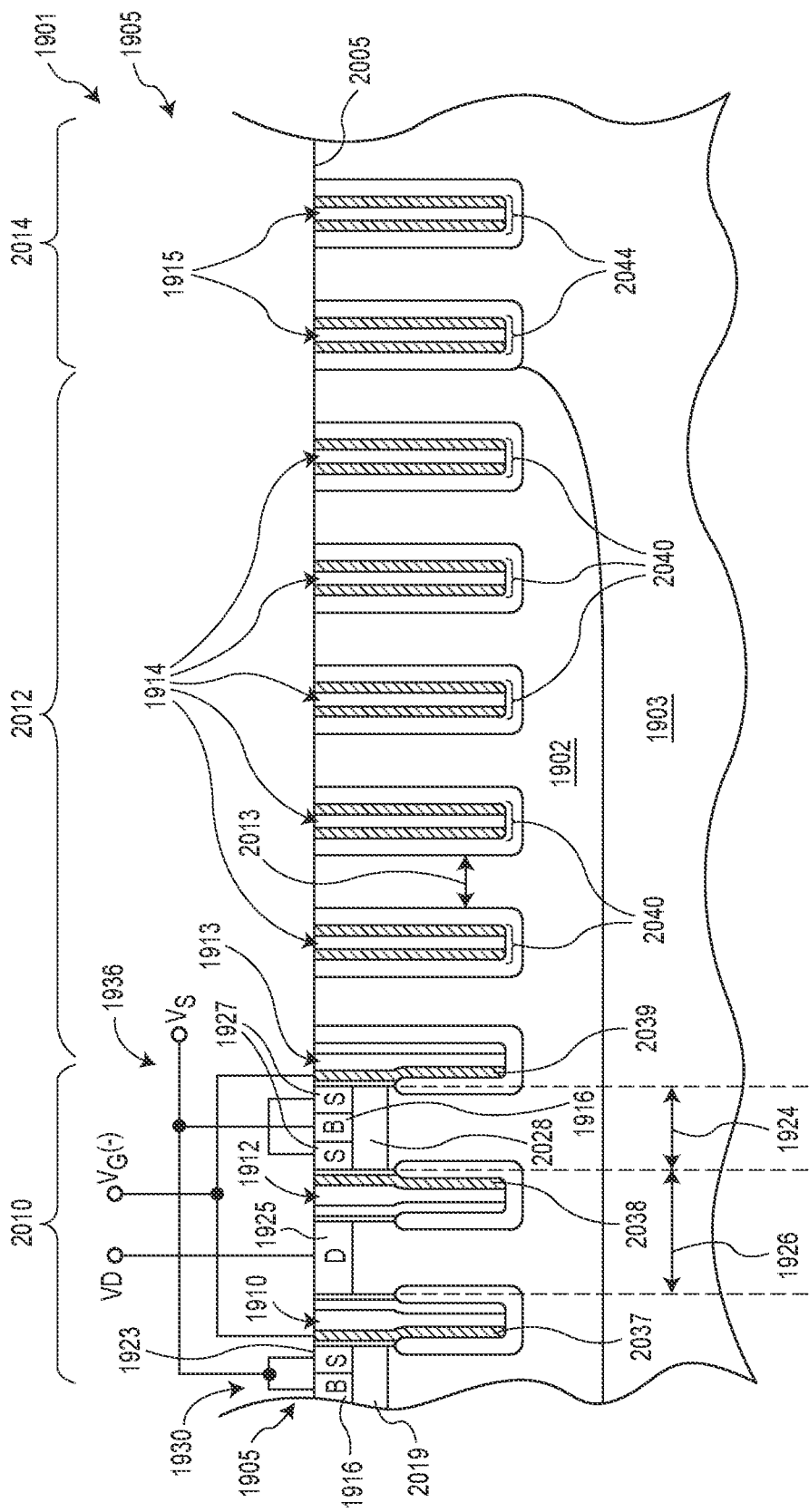
FIGS. 20A-20B are partial cutaways of a side view of transistor device according to another embodiment of the present invention.
Figure 20B:
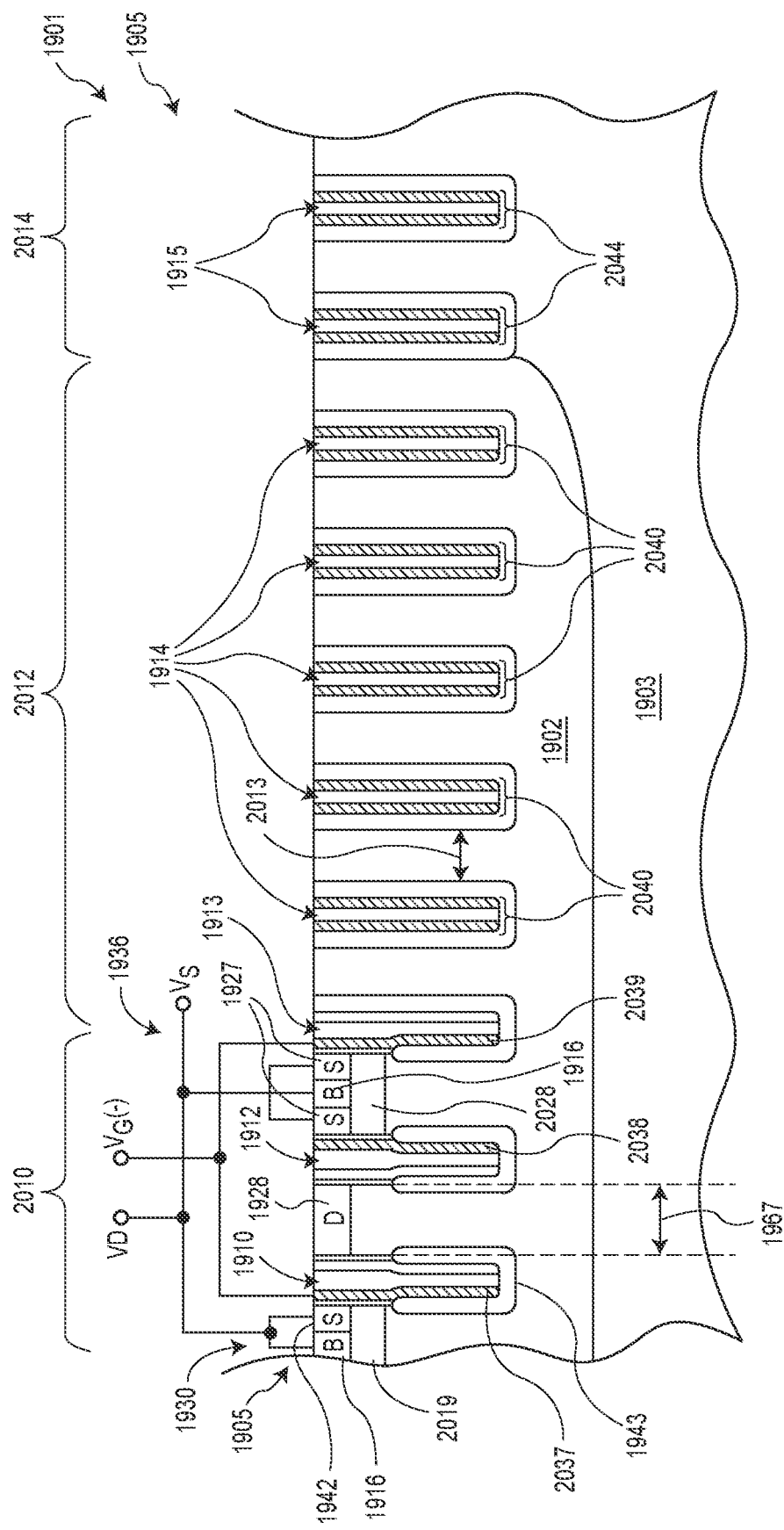

FIGS. 20A-20B are partial cutaways of a side view of wafer 1901 and transistor device 1905 along cut lines 20A and 20B in FIG. 19A, according to an embodiment of the present invention. In an embodiment, and in the side view of FIG. 20A, wafer 1901 and transistor device 1905 may include active region 2010, a trench isolation region 2012, and an exterior region 2014 formed outside trench isolation region 2012. Active region 2010 and trench isolation region 2012 may be formed in doped region 1902, according to an embodiment. Transistor 1930 and exterior transistor 1936 may be formed in active region 2010.

In the embodiment shown in the view of FIGS. 20A and 20B, active region 2010 may include transistor 1930 and exterior transistor 1936. In an embodiment, and as described above in connection with FIGS. 20A and 20B, transistor 1930 and exterior transistor 1936 may include source regions 1923, 1927, trenches 1910, 1912, 1913, drain regions 1925, 1928, and gates ("conductive structures") 2037, 2038, 2039. The structure of, for example, the source regions 1923, 1927, trenches 1910, 1912, drain regions 1925, 1928, and P-well regions 2019, 2028 are analogous to source regions 1623, 1627, trenches 1610, 1612, gates 1637, 1639, drain regions 1625, 1628, P-well regions 1619, 1627, and other structures described previously in connection with FIG. 16. For the sake of brevity, details of these structures and other analogous structures (e.g. body contacts 1615, 1625) are not be described in detail in connection with the present embodiments, except where necessary to describe the present embodiments.

Outer exterior trench (generally "second exterior trench") 1913 defines the outer boundary of active region 2010 in an embodiment. Outer exterior trench 1913 may be formed adjacent to and define the exterior source region 1927, according to an embodiment. In the shown embodiment, conductive structure 2039 is formed in outer exterior trench 1913 and acts as a gate and field plate within outer exterior trench 2013. Isolation trench region 2012 may be formed outside active region 2010 and adjacent outer exterior trench 1913, according to an embodiment. Dummy trenches 1914 may be formed in trench isolation region 2012. Dummy trenches 1914 may be formed in the same manner as trenches 1908, 1910, however, the active semiconductor regions (e.g. source regions 1923, 1927, drain regions 1921, 1928, and the like) and electrical connections to these regions may not be formed, as in the embodiment shown. In an embodiment, one or more of dummy trenches 1914 may include conductive structures configured as isolation field plate electrodes 2040. In an embodiment, the lateral distance 2013 between dummy trenches 1914 may be about the same distance as between trenches 1910, 1912 in the active area 2010. In other embodiments, other lateral distances may be used. In the embodiment shown, isolation field plate electrodes 2040 may be formed on both vertical faces of dummy trenches 1914. In other embodiments (not shown) isolation field plate electrodes 2040 may be formed on one or the other side of dummy trenches 1914. In other embodiments (not shown), isolation field plate structures 2040 may be formed in some, but not all isolation trenches. In the embodiment shown, isolation field plate electrodes may be floating (i.e. not connected to a fixed electrical potential). In other embodiments (not shown) isolation field plate electrodes may be connected to a fixed potential such as a ground or other positive or negative fixed potential.

Exterior isolation region 2014 may be formed outside the isolation trench region 2012. Exterior isolation region 2014 may include portions of wafer 1901 formed in substrate 1903, outside of doped region 1902. In the embodiment shown, dummy trenches 1915 may be formed in exterior region 2014, according to an embodiment. In an embodiment, one or more of dummy trenches 1915 may include exterior isolation field plate electrodes 2044. In the embodiment shown, exterior isolation field plate electrodes 2044 may be floating. In other embodiments, exterior isolation field plate electrodes 2044 may be connected to a fixed potential. In still other embodiments, dummy trenches 1915 may be filled with dielectric material and not include field plates (not shown).

Figures 21A, 21B:
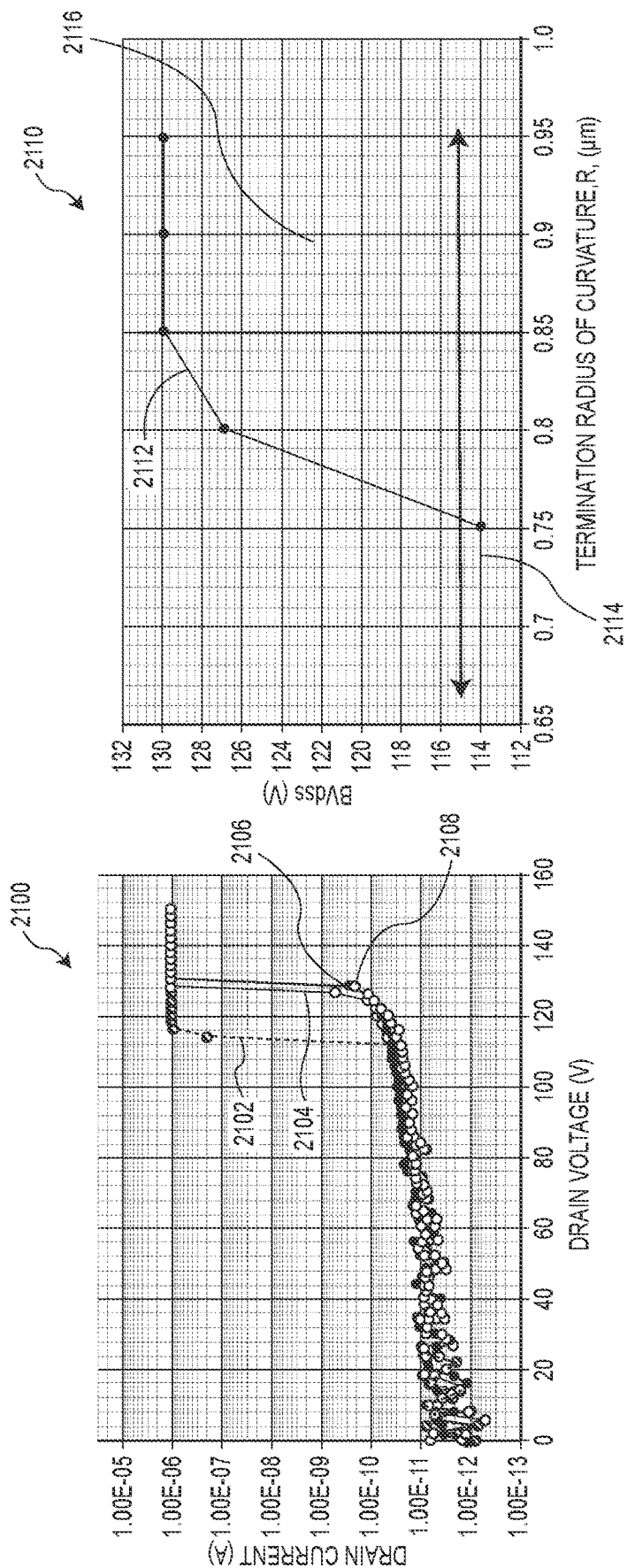
FIG. 21A is a graphical representation of off-state drain current vs. drain voltage for an embodiment of the present invention.
FIG. 21B is a graphical representation of breakdown current for an embodiment of the present invention.

FIGS. 21A and 21B show breakdown performance for the transistor device of FIGS. 19A, 19B, 20A, and 20B. FIG. 21A is a graphical representation 2100 of drain current versus drain voltage for an embodiment of the transistor device of FIGS. 19A, 19B, 20A, 20B. Trace 2102 shows drain current versus drain voltage for an embodiment of the transistor device of FIGS. 19A, 19B, 20A, 20B with a termination radius of curvature 1946, R, of 0.75 microns. In this embodiment, the rapid rise in drain current occurs at a drain voltage of approximately 114 Volts. Here, the rapid rise in current indicates device has reached a drain-source breakdown voltage, BVDSS. In contrast, traces 2104, 2106, 2108 represent drain current versus drain voltage for embodiments having values for radius of curvature 1946 of 0.8 microns, 0.85 microns, 0.9 microns, and 0.95 microns, respectively. Accordingly, traces 2104, 2106, 2108 show BVDSS values of approximately 128 volts to 130V.

FIG. 21B is a graphical representation 2110 of breakdown voltage versus termination radius of curvature 1946 for an embodiment of the present invention. Trace 2112 summarized the values of BVDSS extracted from graph 2110. As shown in graph 2110 and trace 2112, values of termination radius of curvature 1946, below approximately 0.85 microns may result in reduced breakdown voltage in a region 2114 of trace 2212 where BVDSS becomes limited by the termination region due to electric field enhancement at the curved surfaces. Conversely, the portion of trace 2112 in the region 2116 shows a higher breakdown voltage whose value may be limited by the BVDSS of the internal structure (i.e. the regions away from the termination regions 1940, 1945).

Figure 22:
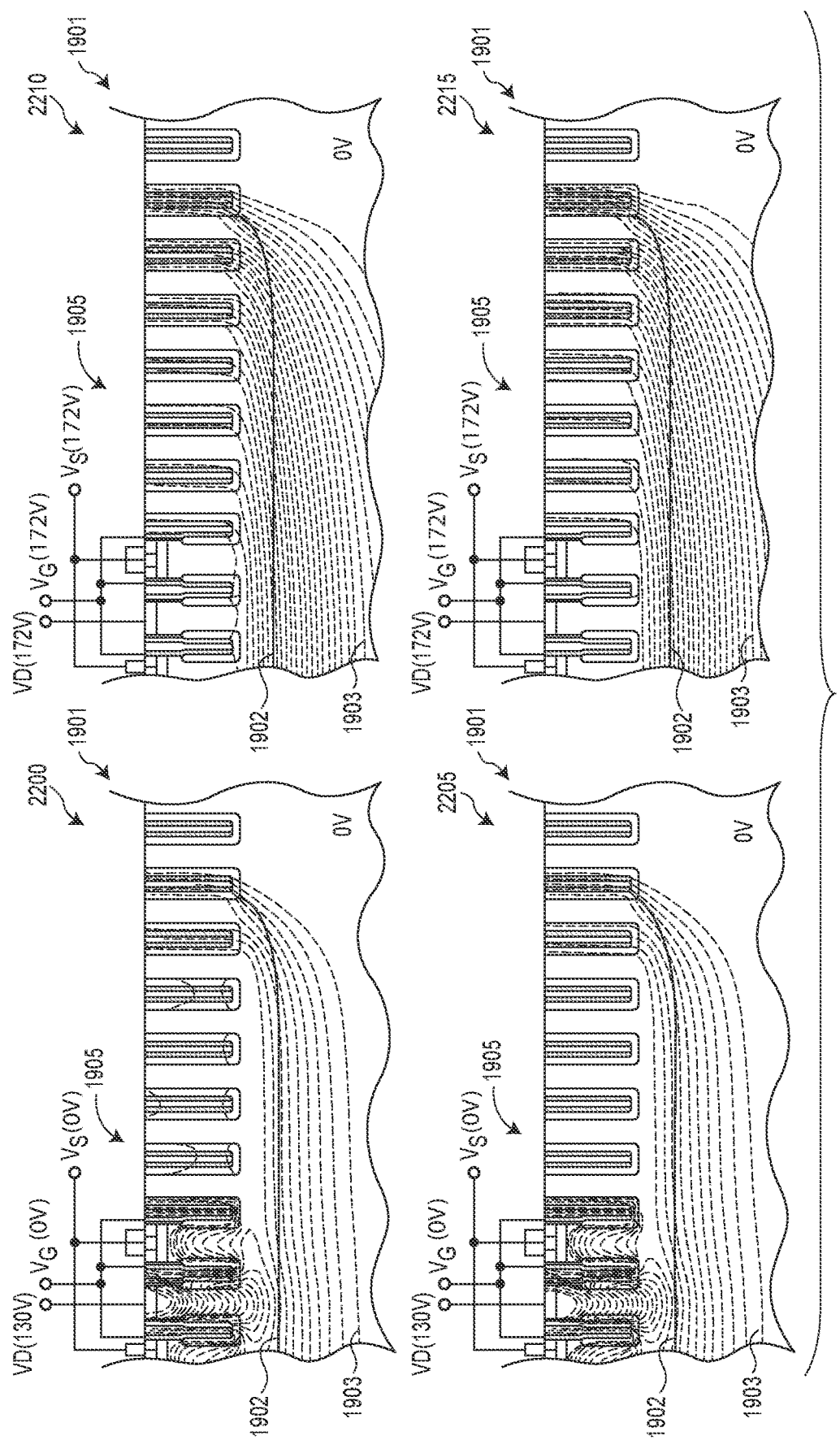
FIG. 22 depicts partial side view illustrations showing potential fields and the electrical coupling of a transistor device during an operating condition according to an embodiment of the present invention.

FIG. 22 depicts partial side views 2200, 2205, 2210, 2215 showing simulated electrical equipotential lines of the portion of wafer 1901 shown in FIGS. 20A and 20B in an operating condition according to an embodiment of the present invention. The electrical equipotential lines in views 2200 and 2210 are simulated using cylindrical symmetry to represent the circular part of the termination region of cutline 20B of FIG. 20B, while the electric potential distribution in views 2205 and 2215 in the interior structure according to cutline 20A of FIG. 20A are simulated in Cartesian coordinates.

In view 2200, electrical equipotential field lines are shown corresponding to the side view of FIG. 20B with a drain voltage set at the drain breakdown voltage, BVDSS, of 130V from FIG. 21B. In view 2205, electrical equipotential field lines are shown corresponding to the side view of FIG. 20A with a drain voltage set at the drain breakdown voltage, BVDSS, of 130V from FIG. 21B. In both views, 2200 and 2205, corresponding to cutline 20A and cutline 20B of FIGS. 20A and 20B, respectively, similar configurations are seen for the electrical equipotential lines, indicating a uniform field distribution.

In view 2210, electrical equipotential field lines are shown corresponding to the side view of FIG. 20B with terminal set at the high-side breakdown voltage, i.e. the breakdown of 172V for doped region 1902 into substrate 1903, according to an embodiment. In a view 2215, electrical equipotential field lines are shown corresponding to the side view of FIG. 20A with a drain voltage set at the high side breakdown voltage of 172V. In both views, 2210 and 2215, corresponding to cutline 20A and cutline 20B, similar configurations are seen for the electrical equipotential lines, indicating a uniform field distribution. Note that not all equipotential lines for the various mode of operation shown may be shown in FIGS. 22A and 22B.

Figure 23A:
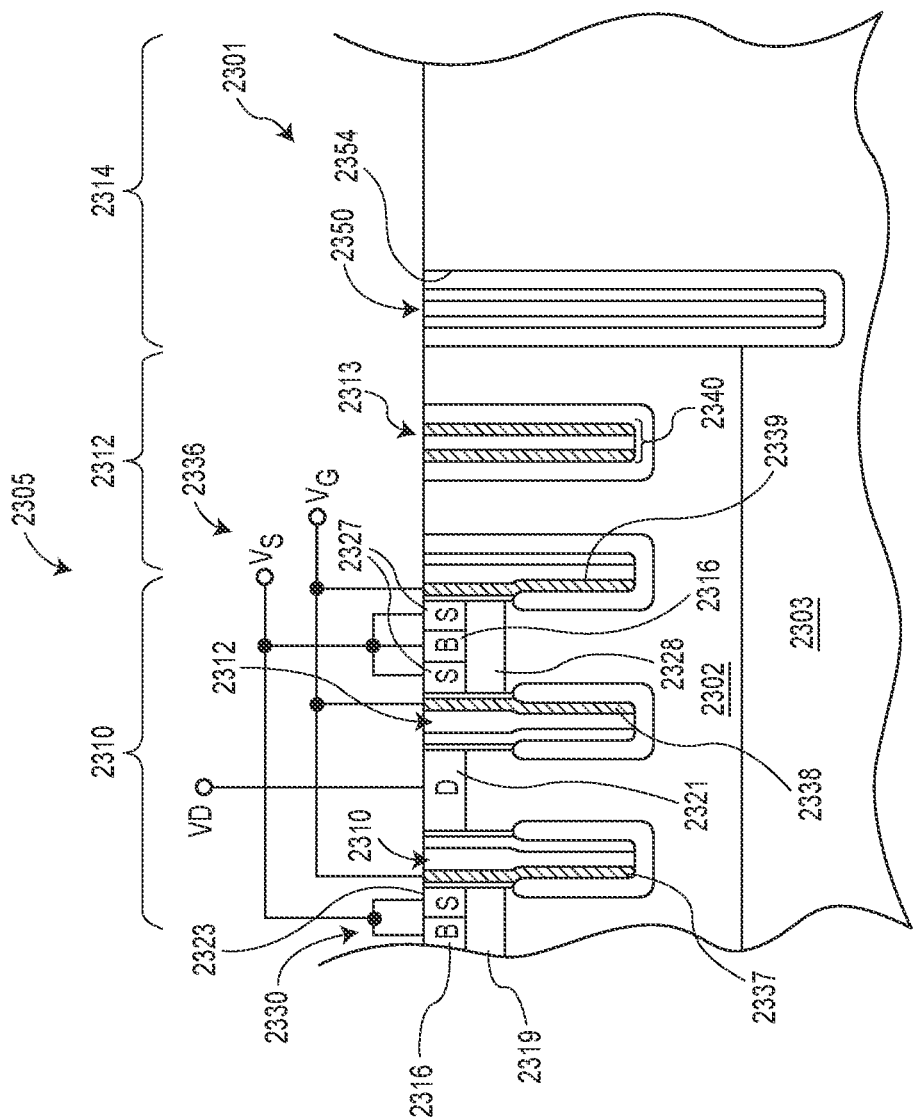
FIGS. 23A-23B are partial cutaways of a side view of transistor device according to another embodiment of the present invention.
Figure 23B:
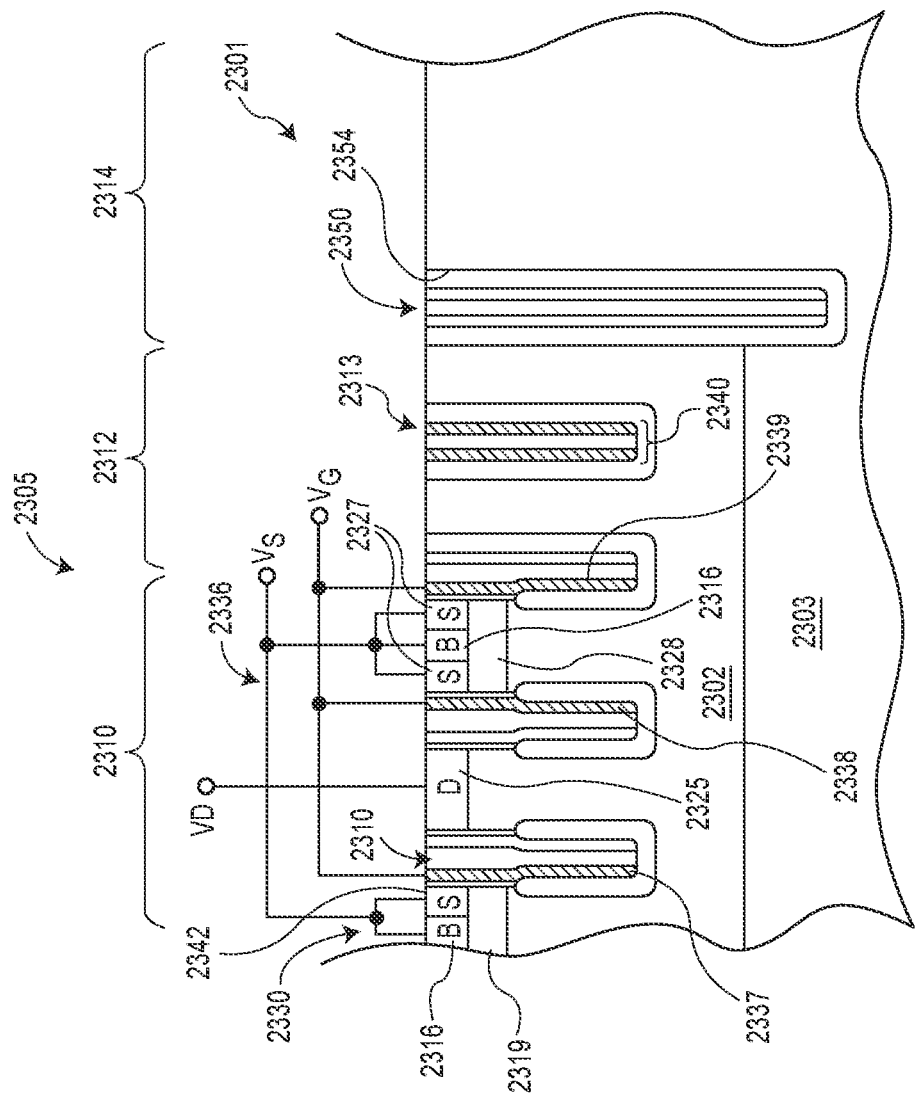

FIGS. 23A-23B are partial cutaways of a side view of a transistor device 2305 according to another embodiment of the present invention. An embodiment may include active area 2310, trench isolation region 2312, and deep trench isolation (DTI) structure 2350. In the embodiment shown, DTI structure 2350 may be used to terminate the electric fields produced by transistor 2330 (partial view of half transistor only) and exterior transistor 2336.

Active area 2310 may be formed in doped region 2302 within substrate 2303 and may include transistor 2330 and exterior transistor 2336. The structure of transistor 2330 and transistor 2336 are analogous to the structure and function of transistors 1930 and 1936 of FIGS. 19A, 19B, 20A, 20B where like-numbered elements have the same structure and function, only that they begin with "23." For the sake of brevity, these elements common to both embodiments will not be discussed here, except where necessary to describe the current embodiment.

Trench isolation region 2312 may include dummy trench 2313 formed in doped region 2302, according to the embodiment shown. Other embodiments may include additional dummy trenches (not shown). Analogously to the device of FIGS. 20A and 20B, and in the embodiment shown, isolation field plate electrodes 2340 may be formed on both vertical faces of dummy trenches 2313. In other embodiments (not shown) isolation field plate electrodes 2340 may be formed on one or the other side of dummy trenches 2313. In other embodiments (not shown), isolation field plate structures 2340 may be formed in some, but not all, isolation trenches. In the embodiment shown, isolation field plate electrodes may be floating (i.e. not connected to a fixed electrical potential). In other embodiments (not shown) isolation field plate electrodes may be connected to a fixed potential such as a ground or other positive or negative fixed potential.

Exterior isolation region 2314 may be formed outside trench isolation region 2312 in substrate 2303. In an embodiment, exterior isolation region 2314 may not include doped region 2302. In other embodiments, exterior isolation region 2314 may include at least a portion of doped region 2302. In an embodiment, exterior isolation region 2014 may include a deep trench isolation (DTI) structure 2350. The DTI structure 2350 may include a DTI trench 2354 in substrate 2303 that is formed, e.g., by dry etching. The DTI trench 2354 may be filled with an insulating or highly resistive material (e.g. silicon dioxide, silicon nitride, poly Si, or Si) to form the DTI structure 2350. In some embodiments, the DTI trench 2354 may include a doped semiconductor layer (e.g. P-type layer) to enhance the isolation properties of the DTI structure 2350. In other embodiments, the exterior isolation region may include implanted regions of the substrate 2303 (not shown). In other embodiments, the DTI structure may include one or more conductive field plates formed, e.g. with poly-Si, in the DTI trench. In these other embodiments, the poly-Si may be used to make and electrical contact to the substrate 2303.

Figure 24:
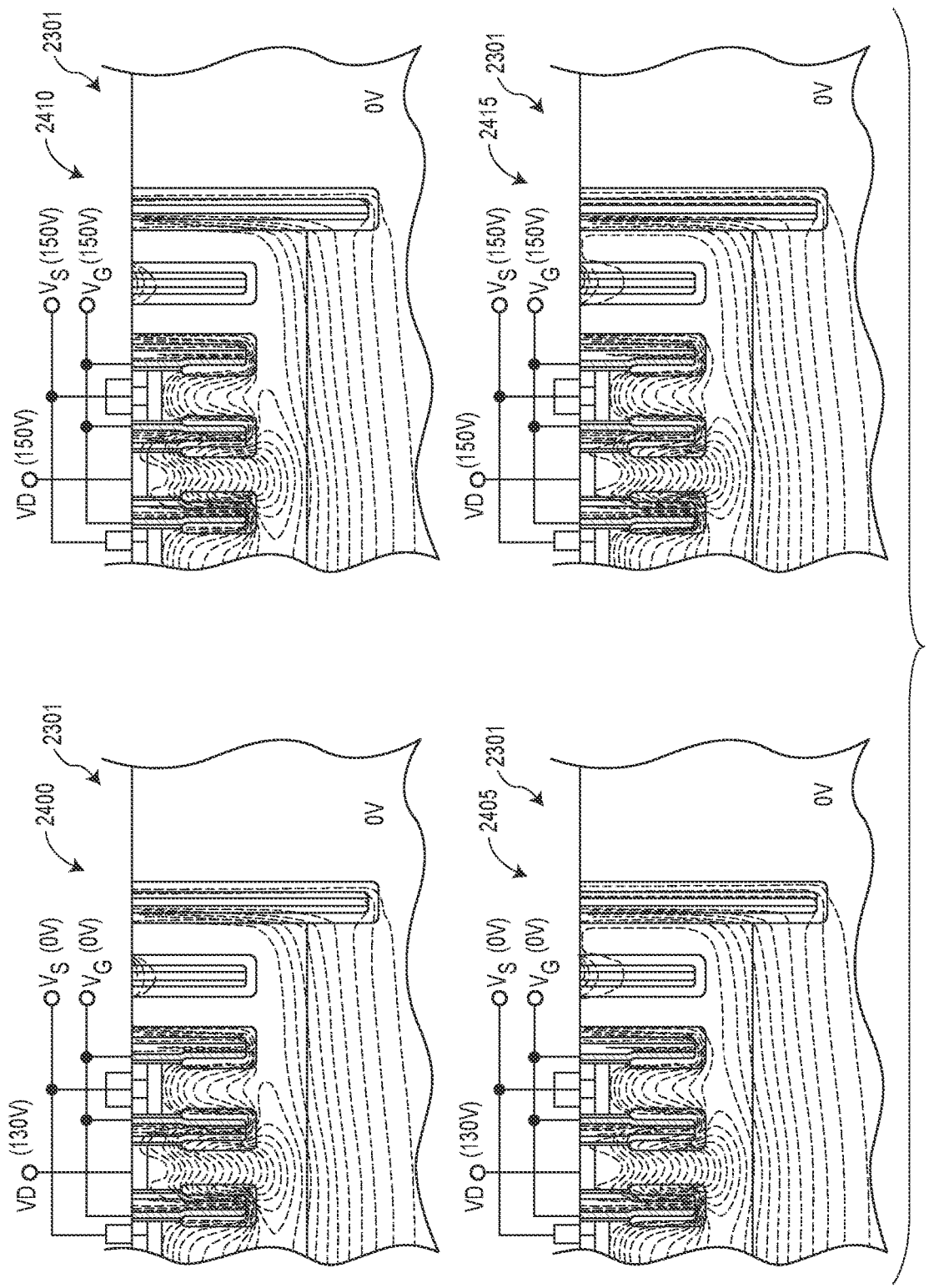
FIG. 24 depicts partial side view illustrations showing potential fields and the electrical coupling of a transistor device during an operating condition according to an embodiment of the present invention.

FIG. 24 depicts partial side views 2400, 2405, 2410, 2415 showing simulated electrical equipotential lines of the portion of wafer 2301 shown in FIGS. 23A and 23B in an operating condition according to an embodiment of the present invention. The simulated electrical equipotential lines are simulated using cylindrical symmetry to accurately represent the dumbbell-shaped source termination regions 1942, 1947 of FIG. 19B.

In view 2400, electrical equipotential field lines are shown corresponding to the side view of FIG. 23B with a drain voltage set at a drain breakdown voltage, BVDSS, of 130V. In view 2405, electrical equipotential field lines are shown corresponding to the side view of FIG. 23A with a drain voltage set at the drain breakdown voltage, BVDSS, of 130V. In both views, 2400 and 2405, corresponding to views 24A and 24B, similar configurations are seen for the electrical equipotential lines, indicating a uniform field distribution.

In view 2410, electrical equipotential field lines are shown corresponding to the side view of FIG. 23B with terminal voltages set at a high-side drain breakdown voltage of 150V. In view 2415, electrical equipotential field lines are shown corresponding to the side view of FIG. 23A with drain, source, and gate voltages set at the high side breakdown voltage of 155V. In both views, 2410 and 2415, corresponding to views 23A and 23B, similar configurations are seen for the electrical equipotential lines, indicating a uniform field distribution. Note that not all equipotential lines for the various mode of operation shown may be shown in FIGS. 22A and 22B.

It should be appreciated that the embodiments of the inventive subject matter described herein are exemplary and do not limit the scope of the inventive subject matter. In addition, features shown or described herein with respect to one embodiment may be implemented in other embodiments shown or described herein. For example, while embodiments of transistor devices 1905, 2305, may be implemented as unidirectional transistor devices, without departing from the scope of the inventive subject matter, transistor devices with termination regions analogous to transistor devices 1905 and 2305 may be implemented as bi-directional transistor devices by arranging the individual transistors (e.g. 1930 of transistor device 1905) in a back to back configuration and by optimizing the doping levels of the drain regions and source regions, analogous to the description of the bi-direction transistor device 1400 of FIG. 14.

Likewise, without departing from the scope of the inventive subject matter, other embodiments (not shown) may include more than one exterior transistors, analogous to exterior transistor 1936 of FIGS. 19A, 19B, 20A, and 20B. In these further embodiments, additional exterior source region(s), exterior trench region(s), and exterior drain region(s) may surround a first exterior transistor analogous to exterior transistor 1936. The number of additional exterior transistors may depend on the design goals of the transistor device in these and other embodiments.

In addition, and again without departing from the inventive subject matter, still other embodiments (not shown) analogous to transistor device 1905 may have gates and field plates formed separately. In these embodiments, a separate gate may be formed to electrically couple to a semiconductor sidewall in an upper portion of a trench and a separate field plate may be formed to couple with a semiconductor sidewall in a lower portion of the trench. A thicker dielectric layer may be formed between a trench sidewall and the field plate than the dielectric between the gate and the trench sidewall. In these still other embodiments, the separated gates and field plates may be connected to the same potential (e.g. a gate bias) or may be connected to different potentials (e.g. gate bias for the gates and ground or other potential for the field plates).

As disclosed herein, a first structure is "directly over" a second structure if the first structure is located over the second structure in a line having a direction that is perpendicular with the generally planar major side of a wafer. For example, in FIG. 13, contact 1319 is directly over P well region 1307. Contact 1319 is not directly over P-well region 1309. As disclosed herein, a first structure is "directly beneath" a second structure if the first structure is located beneath the second structure in a line having a direction that is perpendicular with the generally planar major side of the wafer. For example, in FIG. 13, plate structure 905 is directly beneath layer 1321. Plate structure 905 is not directly beneath contact 1319. One structure is "directly between" two other structures in a line if the two structures are located on opposite sides of the one structure in the line. For example, in FIG. 12, plate structure 905 is located directly between structure 901 and dielectric structure 1003 in a line in the cut away side view of FIG. 13. Region 102 is not located directly between regions 1301 and 1303 in a line. A "lateral line" is a line that is parallel with a generally planar major side of the wafer. In FIG. 13, structure 903 and field plate structure 905 are located in a lateral line. Contact 1319 and region 102 are not located in a lateral line. As disclosed herein, a first structure is "laterally separated" from a second structure if there is separation between the two structures in a line that is parallel with a generally planar major side of the wafer. For example, in FIG. 13, plate structures 903 and 905 are laterally separated from each other. As disclosed herein, a "lateral distance" is the distance in a direction that is parallel with a generally planar major side of the wafer. A "vertical component sidewall" of a trench is a portion of a trench sidewall having a profile that overall, the majority component of the portion is vertical even though it may also have a horizontal component or that it may have minor horizonal discontinuity at an interior location of the sidewall portion. For example, a portion of a sidewall sloped at 70 degrees may be considered a vertical component sidewall portion.

In one aspect, a transistor device may include a substrate that includes an upper surface, a first current-carrying region, formed in the substrate and having a first lateral width. An embodiment may include a second current-carrying region formed in the substrate, having a second lateral width, and adjacent the first current carrying region. A first trench may be formed in the substrate between the first current-carrying region and the second current-carrying region, wherein the first trench extends from the upper surface of the substrate to a first depth within the substrate, according to an embodiment. In an embodiment, the first trench may include a first vertical component sidewall of semiconductor material coupled to the first current-carrying region and a second vertical component sidewall of semiconductor material, coupled to the second current-carrying region and opposite the first vertical component sidewall. A first conductive structure may be formed within the first trench between the first current-carrying region and the second current carrying region, according to an embodiment. According to an embodiment, a first termination region may be coupled to the first current carrying region and the second current-carrying region, and the first trench and may include a first termination portion coupled to the first current-carrying region, a second termination portion coupled to the second current-carrying region, and a first trench termination portion coupled to the first trench. The second termination portion and the second current-carrying region may surround a portion of the first trench termination portion and a portion of the first current-carrying region, according to an embodiment. In an embodiment, the first trench termination portion and the first trench may surround a portion of the first termination portion and the first current-carrying region. A width of the first termination portion may exceed a width of the first current carrying region, according to an embodiment.

In another aspect, the inventive subject matter may include a metal-oxide semiconductor field effect transistor device. In an embodiment, the metal-oxide semiconductor field effect transistor device may include a substrate that includes an upper surface. A first source region may be formed in the substrate with a first lateral width and a first drain region may be formed in the substrate with a second lateral width, and adjacent the first source region, according to an embodiment. In an embodiment, a first trench may be formed in the substrate between the first source region and the first drain region, wherein the first trench may extend from the upper surface of the substrate to a first depth within the substrate. The first trench may include a first vertical component sidewall of semiconductor material coupled to the first source region and a second vertical component sidewall of semiconductor material, coupled to the first drain region and opposite the first vertical component sidewall, according to an embodiment.

In an embodiment, a conductive structure may be formed within the first trench, wherein the conductive structure may be located at least partially in the first trench closer to the first vertical component sidewall than the second vertical component sidewall. The conductive structure may be laterally separated by dielectric by a first lateral distance from a first portion of the first vertical component sidewall and may be laterally separated by a dielectric by a second lateral distance from a second portion of the first vertical component sidewall, wherein the first lateral distance may be less than the second lateral distance, according to an embodiment. In an embodiment, the conductive structure may serve as a gate and a field plate.

An embodiment may include a first termination region that includes a first source termination portion coupled to the first source region having a first termination lateral width, a first drain portion coupled to the first drain region, and a first trench termination portion coupled to the first trench. The first drain portion and the first drain region may surround the first trench termination portion and the first trench, wherein the first trench termination portion and the first trench may surround the first termination portion and the first source region, according to an embodiment. In an embodiment, the first termination lateral width may exceed the first lateral width.

An embodiment may also include an exterior termination region that may include a first exterior trench that may define an exterior drain region and an exterior source region. The first exterior trench may include a first exterior vertical component sidewall of semiconductor material coupled to the exterior source region and a second exterior vertical component sidewall of semiconductor material coupled to an exterior drain region, opposite the first exterior vertical component sidewall, according to an embodiment. In an embodiment, the exterior drain region may be coupled to and adjacent the first drain region and drain termination portion of the first termination region and may surround the first source region, the first drain region, the first trench, and the first termination region. In an embodiment, a width of an exterior distance between the first termination trench and the exterior trench may be less than the width of the first source region.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A transistor device comprising:
   a substrate that includes an upper surface;
   a first current-carrying region, formed in the substrate and having a first lateral width in a first direction;
   a second current-carrying region formed in the substrate, having a second lateral width in a second direction parallel to the first direction, and adjacent the first current carrying region;
   a first trench formed in the substrate between the first current-carrying region and the second current-carrying region, wherein the first trench extends from the upper surface of the substrate to a first depth within the substrate, and wherein the first trench includes a first vertical component sidewall of semiconductor material coupled to the first current-carrying region and a second vertical component sidewall of semiconductor material, coupled to the second current-carrying region and opposite the first vertical component sidewall, wherein the first vertical component sidewall of the first trench defines an elongated portion of the upper portion of the substrate, the elongated portion including an end region and a non end region, wherein the first lateral width is a minimum lateral width of the elongated portion in the non end region, wherein the first lateral width is between a first set of two portions of the first vertical component sidewall in the non end region;

a first conductive structure formed within the first trench; and a first termination region that includes a first termination portion located in the end region and coupled to the first current-carrying region and having a first termination lateral width, a second termination portion coupled to the second current-carrying region and having a second termination lateral width, and a first trench termination portion coupled to the first trench, wherein the second termination portion and the second current-carrying region surround a portion of the first trench termination portion and the first trench, wherein the first trench termination portion and the first trench surround a portion of the first termination portion and the first current-carrying region, and wherein the first termination lateral width is between a second set of two portions of the first vertical component side wall in the end region and extends in a third direction parallel to the first direction, wherein the first termination lateral width exceeds the first lateral width, wherein the first set of two portions is lateral to the second set of two portions.

2. The transistor device of claim 1, wherein:

the first conductive structure is located at least partially in the first trench closer to the first vertical component sidewall than the second vertical component sidewall; and the first conductive structure is laterally separated by dielectric by a first lateral distance from a first portion of the first vertical component sidewall and is laterally separated by a dielectric by a second lateral distance from a second portion of the first vertical component sidewall, wherein the first lateral distance is less than the second lateral distance, and wherein the first conductive structure serves as a control terminal for a transistor and a field plate for the transistor.

3. The transistor device of claim 2, wherein the dielectric separating the first portion from the conductive structure includes a dielectric layer having a first thickness, wherein the dielectric separating the second portion from the conductive structure includes a second dielectric layer having a second thickness, wherein the first thickness is less than the second thickness.

4. The transistor device of claim 2 wherein the first current-carrying region is configured as a source region, the second current-carrying region is configured as a drain region, the drain region located in the semiconductor material laterally adjacent to the second vertical component sidewall, and wherein the drain region is located at the upper surface of the substrate.

5. The transistor device of claim 1, further comprising:

a second trench formed in the substrate and laterally adjacent the second current-carrying region;

a third current-carrying region formed in the substrate and laterally adjacent second trench;

a fourth current-carrying region formed in the substrate, coupled to the second current-carrying region, laterally adjacent the second trench and;

wherein:

the second trench extends from the upper surface of the substrate to the first depth within the substrate, and wherein the second trench includes a third vertical component sidewall of semiconductor material coupled to the third current-carrying region and a fourth vertical component sidewall of semiconductor material coupled to the fourth current-carrying region and opposite the third vertical component sidewall; and a second termination region that includes a third termination portion electrically coupled to the third current-carrying region, a fourth termination portion electrically coupled to the fourth current carrying region, and a second trench termination portion coupled to the second trench, and wherein the fourth termination portion and the fourth current-carrying region surround the second trench, the second termination trench portion, and the third current-carrying region.

6. The transistor device of claim 5, wherein a minimum distance between the first termination trench and the second termination trench exceeds a minimum choke region distance, wherein the minimum choke region distance has a value between 0.3 times the second termination lateral width and 0.7 times the second termination lateral width.

7. The transistor device of claim 1, wherein the first termination portion has a radius of curvature having a value between 0.5 times the first lateral width and 1.0 times the first lateral width.

8. The transistor device of claim 1, wherein the second lateral width exceeds the second termination lateral width.

9. The transistor device of claim 1, further comprising an exterior termination region that surrounds the first current-current carrying region, the second current-carrying region, and the first termination region.

10. The transistor device of claim 9, wherein the exterior termination region includes a first exterior trench that defines a first exterior current-carrying region, wherein the first exterior trench includes a first exterior vertical component sidewall of semiconductor material coupled to the first exterior current-carrying region and a second exterior vertical component sidewall of semiconductor material coupled to a second exterior current-carrying region, opposite the first exterior vertical component sidewall, and wherein the second exterior current carrying region is coupled to and adjacent the second current-carrying region and the second termination portion of the first termination region and surrounds the first current-carrying region, the second current-carrying region, the first trench, and the first termination region.

11. The transistor device of claim 10, wherein a conductive structure is located at least partially in the first exterior trench closer to the first exterior vertical component sidewall than the second vertical exterior component sidewall and the conductive structure is laterally separated by dielectric by a first lateral distance from a first portion of the first vertical component sidewall and is laterally separated by a dielectric by a second lateral distance from a second portion of the first vertical component sidewall, wherein the first lateral distance is less than the second lateral distance, wherein the conductive structure serves as a control terminal for a transistor and a field plate.

12. The transistor device of claim 10, wherein a first exterior distance between the first termination trench and the exterior trench is less than the second lateral width of the second current-carrying region.

13. The transistor device of claim 10, wherein the exterior termination region includes a second exterior trench, wherein the second exterior trench includes a third exterior vertical component sidewall of semiconductor material coupled to the first exterior current-carrying region and a fourth exterior vertical component sidewall of semiconductor material, opposite the first exterior vertical component sidewall, and wherein the second exterior trench surrounds first exterior trench.

14. The transistor device of claim 13, wherein a second exterior distance between the first exterior trench and the second exterior trench is less than the first lateral width of the first current-carrying region.

15. The transistor device of claim 9, further comprising an isolation exterior region.

16. The transistor device of claim 15, wherein the isolation exterior region includes an isolation exterior trench that includes a first isolation exterior vertical component sidewall of semiconductor material and a second exterior vertical component sidewall of semiconductor material, opposite the first isolation exterior vertical component sidewall, and wherein the isolation exterior trench surrounds the first exterior trench.

17. The transistor device of claim 16, wherein a second conductive structure is located at least partially in the exterior isolation trench on at least one of a first isolation exterior vertical component sidewall and the second isolation exterior vertical component sidewall, wherein the second conductive structure is laterally separated by dielectric from the first isolation exterior vertical component sidewall and the second isolation exterior vertical component sidewall, wherein the second conductive structure serves as a field plate.

18. The transistor device of claim 17, wherein the second conductive structure has an electric potential that is floating.

19. The transistor device of claim 15, wherein the isolation exterior region includes a deep-trench isolation structure.

20. A metal-oxide semiconductor field effect transistor device comprising:
 a substrate that includes an upper surface;
 a first source region, formed in the substrate and having a first lateral width;
 a first drain region formed in the substrate, having a second lateral width, and adjacent the first source region;
 a first trench formed in the substrate between the first source region and the first drain region, wherein the first trench extends from the upper surface of the substrate to a first depth within the substrate, and wherein the first trench includes a first vertical component sidewall of semiconductor material coupled to the first source region and a second vertical component sidewall of semiconductor material, coupled to the first drain region and opposite the first vertical component sidewall, wherein the first vertical component sidewall of the first trench defines an elongated portion of the upper portion of the substrate, the elongated portion including an end region and a non end region, wherein the first lateral width is a minimum lateral width of the elongated portion in the non end region, wherein the first lateral width is between a first set of two portions of the first vertical component sidewall in the non end region;
 a conductive structure formed within the first trench, wherein the conductive structure is located at least partially in the first trench closer to the first vertical component sidewall than the second vertical component sidewall; and, wherein the conductive structure is laterally separated by dielectric by a first lateral distance from a first portion of the first vertical component sidewall and is laterally separated by a dielectric by a second lateral distance from a second portion of the first vertical component sidewall, wherein the first lateral distance is less than the second lateral distance, and wherein the conductive structure serves as a gate and a field plate;
 a first termination region that includes a first source termination portion in the end region coupled to the first source region having a first termination lateral width that is between a second set of two portions of the first vertical component side wall in the end region and extends in a third direction parallel to the first lateral width, wherein the first set of two portions is lateral to the second set of two portions the first termination region includes a first drain termination portion coupled to the first drain region, and a first trench termination portion coupled to the first trench, wherein the first drain termination portion and the first drain region surround a portion the first trench termination portion and a portion of the first trench, wherein the first trench termination portion and the first trench surround a portion the first source termination portion and the first source region, and wherein the first termination lateral width exceeds the first lateral width; and
 an exterior termination region that includes a first exterior trench that defines an exterior drain region and exterior source region, wherein the first exterior trench includes a first exterior vertical component sidewall of semiconductor material coupled to the exterior source region and a second exterior vertical component sidewall of semiconductor material coupled to an exterior drain region, opposite the first exterior vertical component sidewall, wherein the exterior drain region is coupled to and adjacent the first drain region and drain termination portion of the first termination region and the first exterior trench surrounds a portion of the first source region, a portion of the first drain region, a portion of the first trench, and a portion of the first termination region, and wherein an exterior distance between the first termination trench and the exterior trench is less than the width of the first source region.

21. The transistor device of claim 20, further comprising:
 a second trench formed in the substrate and laterally adjacent the first drain region;
 a second source region formed in the substrate and laterally the adjacent second trench on an opposite side of the second trench from the first drain region;
 a second drain region formed in the substrate, coupled to the first drain region, laterally adjacent the second trench and between the second trench and the first drain region;
 wherein:
  the second trench extends from the upper surface of the substrate to the first depth within the substrate, and wherein the second trench includes a third vertical component sidewall of semiconductor material coupled to the second source region and a fourth vertical component sidewall of semiconductor material coupled to the second drain region and opposite the third vertical component sidewall; and
 a second termination region that includes a second source termination portion electrically coupled to the second source region, a second drain termination portion electrically coupled to the second drain region, and a second trench termination portion coupled to the second trench, and wherein the second drain termination portion and the second drain region surround a portion of the second trench, a portion of the second termination trench portion, and a portion the second source region.

* * * * *